United States Patent
Yang et al.

(10) Patent No.: US 9,559,134 B2
(45) Date of Patent: Jan. 31, 2017

(54) DEEP TRENCH SPACING ISOLATION FOR COMPLEMENTARY METAL-OXIDE-SEMICONDUCTOR (CMOS) IMAGE SENSORS

(71) Applicant: Taiwan Semiconductor Manufacturing Co., Ltd., Hsin-Chu (TW)

(72) Inventors: Tai-I Yang, Hsinchu (TW); Jung-I Lin, Hsinchu (TW); Ta-Chun Lin, Zhubei (TW); Tien-Lu Lin, Hsinchu (TW); Chen-Jong Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/564,196

(22) Filed: Dec. 9, 2014

(65) Prior Publication Data
US 2016/0163749 A1   Jun. 9, 2016

(51) Int. Cl.
*H01L 27/148*   (2006.01)
*H01L 29/768*   (2006.01)
*H01L 29/00*   (2006.01)
*H01L 27/146*   (2006.01)
*H01L 27/092*   (2006.01)
*H01L 29/94*   (2006.01)
*H01L 27/12*   (2006.01)

(52) U.S. Cl.
CPC ....... *H01L 27/1463* (2013.01); *H01L 27/0921* (2013.01); *H01L 27/1203* (2013.01); *H01L 27/14632* (2013.01); *H01L 27/14643* (2013.01); *H01L 27/14654* (2013.01); *H01L 27/14689* (2013.01); *H01L 29/945* (2013.01)

(58) Field of Classification Search
CPC .......... H01L 27/1463; H01L 27/14609; H01L 27/14643; H01L 29/66181; H01L 29/945; H01L 29/0649; H01L 27/0921; H01L 27/14632; H01L 27/14654; H01L 21/764
USPC ............... 257/522, 506, 510, 292, 223, 291, 446,257/513, 520, 524
See application file for complete search history.

(56) References Cited

U.S. PATENT DOCUMENTS

| | | | |
|---|---|---|---|
| 7,012,240 B2 | 3/2006 | Yaung | |
| 7,511,257 B2 | 3/2009 | Lee et al. | |
| 8,536,018 B1 * | 9/2013 | Anderson | ......... H01L 21/76283 257/E21.564 |
| 2009/0173976 A1 * | 7/2009 | Augusto | ........... H01L 27/14669 257/292 |
| 2009/0200625 A1 * | 8/2009 | Venezia | ............... H01L 27/1463 257/432 |
| 2009/0315137 A1 * | 12/2009 | Kwon | .................. H01L 27/1463 257/446 |
| 2011/0186918 A1 | 8/2011 | Sung | |
| 2013/0285181 A1 | 10/2013 | Lin et al. | |

* cited by examiner

*Primary Examiner* — Shouxiang Hu
(74) *Attorney, Agent, or Firm* — Eschweiler & Associates, LLC

(57) ABSTRACT

An image sensor employing deep trench spacing isolation is provided. A plurality of pixel sensors is arranged over or within a semiconductor substrate. A trench is arranged in the semiconductor substrate around and between adjacent ones of the plurality of pixel sensors, and the trench has a gap located between sidewalls of the trench. A cap is arranged over or within the trench at a position overlying the gap. The cap seals the gap within the trench. A method of manufacturing the image sensor is also provided.

20 Claims, 20 Drawing Sheets

DEEP TRENCH SPACING ISOLATION FOR COMPLEMENTARY METAL-OXIDE-SEMICONDUCTOR (CMOS) IMAGE SENSORS

BACKGROUND

Digital cameras and optical imaging devices employ image sensors. Image sensors convert optical images to digital data that may be represented as digital images. An image sensor includes an array of pixel sensors, which are unit devices for the conversion of an optical image into digital data. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
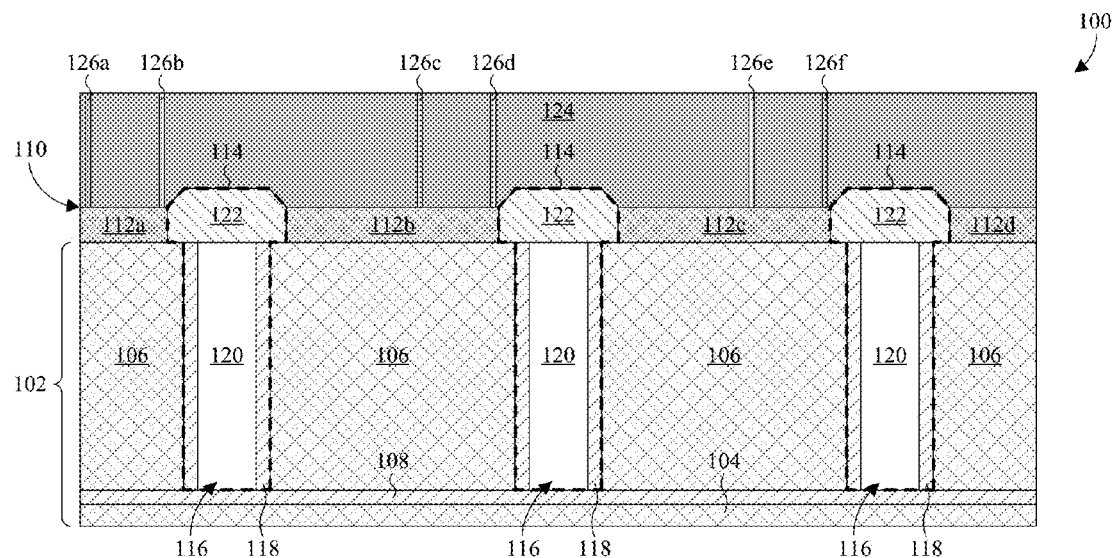
FIG. 1 illustrates a cross-sectional view of some embodiments of an image sensor employing deep trench spacing isolation.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Many portable electronic devices, such as cameras, cellular telephones, personal digital assistants (PDAs), MP3 players, computers and other devices, include an image sensor for capturing images. One example of such an image sensor is a complementary metal-oxide semiconductor (CMOS) image sensor (CIS) including an array of active pixel sensors (APSs). An APS records the intensity of incident light using a photodetector, such as a photodiode, and facilitates digital readout of the recording with a plurality of transistors. According to some types of APS, such as a four transistor (4T) APS, the plurality of transistors include a source follower transistor and a transfer transistor.

Increasingly, CISs are being scaled down to reduce pixel pitch (i.e., the distance between APSs) to sub-micrometer levels (e.g., less than 0.75 micrometers). At such levels, isolation between APSs is of great importance for proper operation. Conventional approaches for isolation employ shallow trench isolation (STI) regions. However, STI regions allow leakage current between neighboring APSs and/or cross talk between neighboring APSs. Further, a junction exists between the STI regions and the regions to be isolated from each other, whereby the junction may cause breakdown voltage and/or latch up concerns. Latch-up is a parasitic circuit effect due to p-n-p-n structures in CMOS devices that can lead to over-current and faulting of the circuit. Collectively, the foregoing can result in APS performance (e.g., signal-to-noise ratio (SNR) or sensitivity) degradation and/or an increased rate of device failure or burnout. Moreover, the density of APSs is limited by the size of the STI regions used to provide adequate isolation.

In view of the foregoing, the present disclosure is directed to an improved CIS employing deep trench spacing isolation. The CIS includes a deep trench spacing isolation region arranged around and between the APSs. The deep trench spacing isolation region includes a deep trench gap sealed by a cap (e.g., a cavity filled with a gas or vacuum). The gap has a low dielectric constant that provides good isolation (e.g., low leakage, a high voltage dependent breakdown voltage, etc.) between adjacent APSs. In some embodiments, the CIS further includes a second deep trench spacing isolation region having a gap, which surrounds the APS array between the APS array and supporting logic arranged around the periphery of the CIS. The present disclosure is also directed to an improved method for manufacturing the improved CIS. The improved isolation provided by the deep trench gap advantageously improves APS density, while reducing leakage and cross talk between neighboring APSs. Further, the improved CIS and method also advantageously increases the breakdown voltage relative to traditional STI regions, breaks parasitic p-n-p-n structures, and blocks parasitic current.

With reference to FIG. 1, a cross-sectional view 100 of some embodiments of an image sensor employing deep trench spacing isolation is provided. The image sensor is typically a CIS and includes a semiconductor substrate 102. The semiconductor substrate 102 is, for example, a bulk substrate of silicon, germanium, or group III and group V elements. Alternatively, the semiconductor substrate 102 is, for example, a semiconductor-on-insulator (SOI) substrate. The SOI substrate includes, for example, a first silicon layer 104 and a second silicon layer 106 stacked vertically on opposing sides of an insulating layer 108 (e.g., a thin layer of active silicon separated from an underlying handle wafer by a layer of insulating material). The first and second silicon layers 104, 106 are or otherwise include, for example, silicon, germanium, or group III and group V elements. The insulating layer 108 is or otherwise includes, for example, a dielectric, such as silicon nitride, silicon dioxide, or silicon oxynitride.

An array 110 of one or more pixel sensors 112a-d, typically APSs, is arranged over and/or within the semiconductor substrate 102. In some embodiments, an epitaxial layer is arranged over the substrate 102 below and/or around the pixel sensor array 110 to improve the defect condition of the substrate surface. Further, in some embodiments, the pixel sensor array 110 includes a first pixel sensor 112a, a second pixel sensor 112b, a third pixel sensor 112c, and a fourth pixel sensor 112d. The pixel sensors 112 correspond to the smallest areas to which photons incident on the pixel sensor array 110 can be localized. The pixel sensors 112 are isolated from each other by a deep trench spacing isolation region 114 arranged around and between the pixel sensors 112.

The deep trench spacing isolation region 114 serves to prevent the leakage of charge and/or cross talk between the pixel sensors 112. The deep trench spacing isolation region 114 includes a trench 116 surrounding the pixel sensors 112. The trench 116 extends into the semiconductor substrate 102, typically at least about 3 micrometers, such as about 7-10 micrometers. Further, in some embodiments, the trench 116 extends through the second silicon layer 106 to the insulating layer 108. The trench 116 has sidewalls lined by a dielectric liner 118, a gap 120 arranged between the lined sidewalls, and is sealed by a cap 122 arranged over and/or within the trench 116. The gap 120 provides spacing isolation between the pixel sensors 112 and can be hermetically sealed with a gas, such as air, therein or vacuum sealed. The dielectric liner 118 and the cap 122 are or otherwise include, for example, silicon nitride, silicon dioxide, or silicon oxynitride. In some embodiments, the gap 120 may vertically extend from a top surface of the second silicon layer 106 to an insulating layer 108 underlying the second silicon layer 106.

Because the gap 120 is filled with a gas or a vacuum, it has a low dielectric constant (e.g., a dielectric constant lower than that of silicon dioxide), which provides for a high degree of isolation between adjacent pixel sensors 112. The high degree of isolation advantageously causes the gap 120 to reduce leakage and cross talk between neighboring pixel sensors 112. Furthermore, because the gap 120 has a lower dielectric constant than traditional STI regions, the breakdown voltage of the deep trench spacing isolation region 114 is advantageously greater than traditional STI regions, thereby blocking or reducing the latch-up effect. Even more, pixel sensor density can be increased due to the improved isolation between pixel sensors 112.

An interlayer dielectric (ILD) layer 124 is arranged over the deep trench spacing isolation region 114 and the pixel sensors 112. Further, contacts 126a-f extend vertically through the ILD layer 124 to the pixel sensors 112. The ILD layer 124 is or otherwise includes, for example, an extreme low-κ dielectric (i.e., a dielectric with a dielectric constant κ less than 2), and the contacts 126 are or otherwise include, for example, a metal, such as copper or tungsten.

Figure 2:
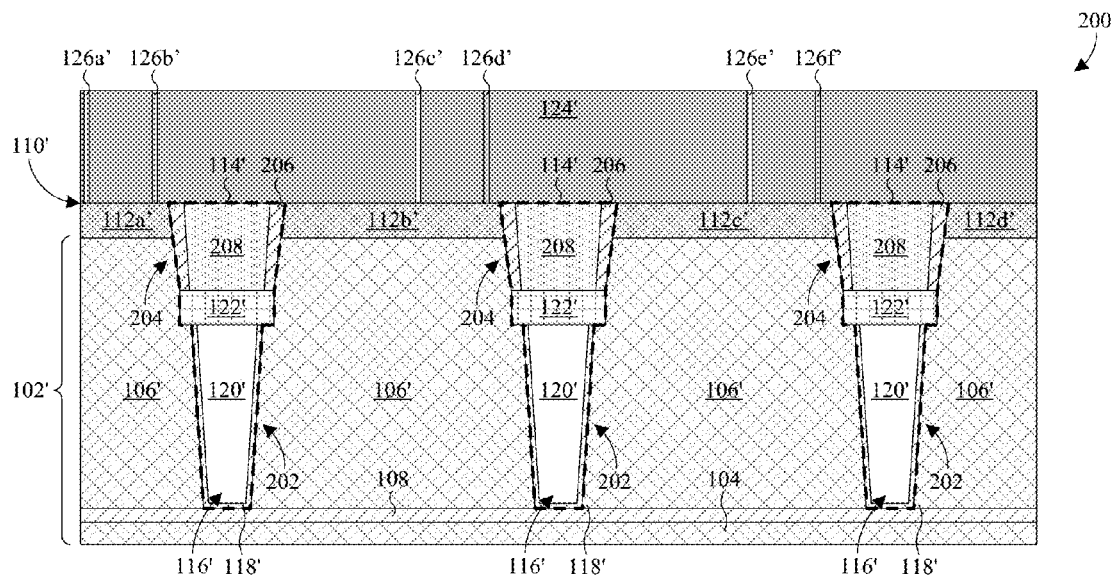
FIG. 2 illustrates a cross-sectional view of alternative embodiments of an image sensor employing deep trench spacing isolation.

With reference to FIG. 2, a cross-sectional view 200 of alternative embodiments of an image sensor employing deep trench spacing isolation is provided. The image sensor includes an array 110' of one or more pixel sensors 112a'-d' arranged over and/or within a semiconductor substrate 102'. In some embodiments, an epitaxial layer is arranged over the substrate 102' below and/or around the pixel sensor array 110' to improve the defect condition of the substrate surface. Further, in some embodiments, the pixel sensor array 110' includes a first pixel sensor 112a', a second pixel sensor 112b', a third pixel sensor 112c', and a fourth pixel sensor 112d'. The semiconductor substrate 102' is, for example, a SOI substrate including a first silicon layer 104 and a second silicon layer 106' stacked vertically on opposing sides of an insulating layer 108. Arranged around and between the pixel sensors 112', a deep trench spacing isolation region 114' provides isolation that prevents the leakage of charge and/or cross talk between the pixel sensors 112'. The deep trench spacing isolation region 114' includes a trench 116' around and between the pixel sensors 112'. The trench 116' extends into the semiconductor substrate 102', typically at least about 3 micrometers, such as about 7-10 micrometers. Further, in some embodiments, the trench 116' extends through the second silicon layer 106' to the insulating layer 108.

The trench 116' is segregated into a deep region 202 and a shallow region 204 by a cap 122' arranged there between. The deep region 202 is arranged below the shallow region 204 and lined by a first dielectric liner 118'. Further, a gap 120' is arranged between the lined sidewalls of the deep region 202 and sealed by the cap 122'. The gap 120' provides spacing isolation between the pixel sensors 112' and can be hermetically sealed with a gas, such as air, therein or vacuum sealed. The shallow region 204 has sidewalls lined by a second dielectric liner 206 and a dielectric core 208 arranged between the lined sidewalls of the shallow region 204. In some embodiments, the shallow region 204 has a larger footprint than the deep region 202. The first dielectric liner 118', the second dielectric liner 206, and the dielectric core 208 are or otherwise include, for example, silicon nitride, silicon dioxide, or silicon oxynitride. The cap 122' is or otherwise includes, for example, a dielectric or silicon.

Figure 3:
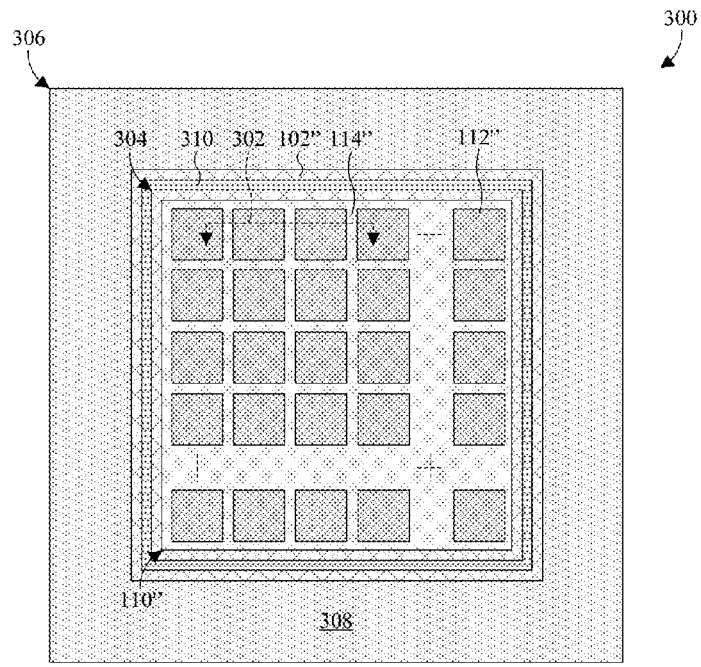
FIG. 3 illustrates a top view of some embodiments of an image sensor employing deep trench spacing isolation.

With reference to FIG. 3, a top view 300 of some embodiments of an image sensor, such as the image sensor of FIG. 1 or 2, employing deep trench spacing isolation is provided. In some embodiments, the cross-sectional views 100, 200 of FIGS. 1 and 2 are taken along a line 302. The image sensor is typically a CIS and includes a semiconductor substrate 102" segregated into a core region 304 and a peripheral region 306. The semiconductor substrate 102" is, for example, a bulk substrate of silicon, germanium, or group III and group V elements. Alternatively, the semiconductor substrate 102" is, for example, a semiconductor-on-insulator (SOI) substrate.

The core region 304 of the semiconductor substrate 102" includes an array 110" of one or more pixel sensors 112", typically APSs, arranged thereover and/or therein. For readability, a single pixel sensor 112" is specifically labeled. The pixel sensors 112" correspond to the smallest areas to which photons incident on the pixel sensor array 110" can be localized. The pixel sensors 112" are isolated from each other by a core isolation region 114". The core isolation region 114" serves to prevent the leakage of charge and/or cross talk between the pixel sensors 112". The core isolation region 114" is a deep trench spacing isolation region according to, for example, FIG. 1 or 2.

The peripheral region 306 of the semiconductor substrate 102" may include an integrated logic circuit (ILC) 308 arranged thereover and/or therein. The ILC 308 supports operation of the of the pixel sensor array 110" and includes electronic components connected by interconnect components. The electronic components include, for example, one or more of transistors, capacitors, resistors, inductors, and diodes. The interconnect components include, for example, one or more of wires, vias, and contacts. The peripheral region 306 is isolated from the core region 304 by a peripheral isolation region 310. The peripheral isolation region 310 serves to prevent the leakage of charge and/or cross talk between the peripheral and core region 304, 306. Typically, the peripheral isolation region 310 is a deep trench spacing isolation region (e.g., according to FIG. 1 or 2), but it can also be other types of isolation region, such as a deep trench isolation (DTI) region or a STI region.

Figure 4:
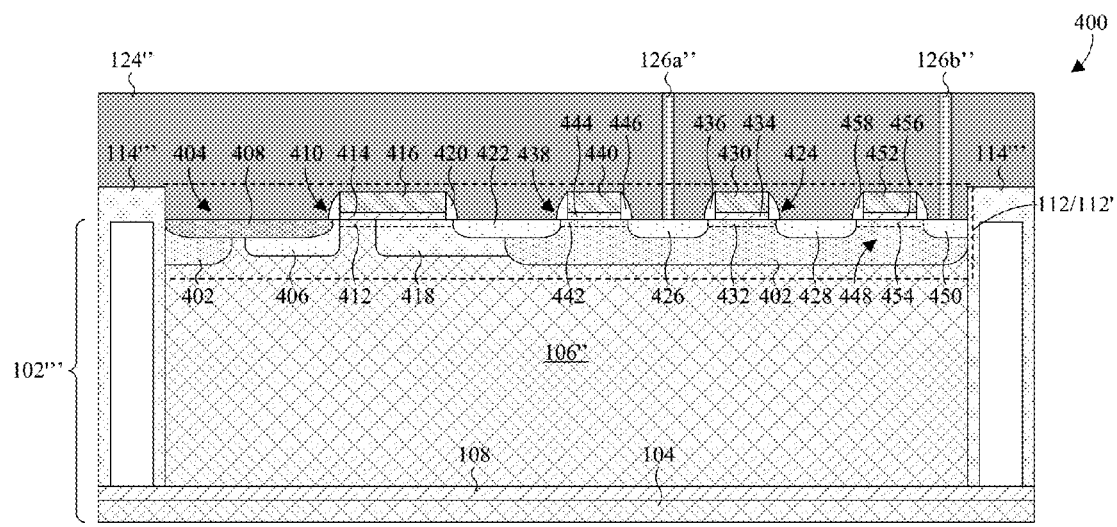
FIG. 4 illustrates a cross-sectional view of some embodiments of a pixel sensor of an image sensor employing deep trench spacing isolation.

With reference to FIG. 4, a cross-sectional view 400 of some embodiments of a pixel sensor, such as a pixel sensor 112, 112' of FIG. 1 or 2, is provided. The pixel sensor is arranged over and/or within a semiconductor substrate 102''' and arranged between a deep trench spacing isolation region 114''' according to, for example, FIG. 1 or 2. In some embodiments, the semiconductor substrate 102''' is a substrate having a first doping type, such as an n- or p-type doping. Typically, the first doping type is a p-type doping. The semiconductor substrate 102''' is, for example, a SOI substrate including a first silicon layer 104 and a second silicon layer 106" stacked vertically on opposing sides of an insulating layer 108. The first and second silicon layers 104, 106" are or otherwise include, for example, silicon, germanium, or group III and group V elements. The insulating layer 108 is or otherwise includes, for example, a dielectric, such as silicon nitride, silicon dioxide, or silicon oxynitride.

In some embodiments, a well region 402 is arranged within the semiconductor substrate 102''' and extends wholly or partially under the pixel sensor. The well region 402 corresponds to a doped region of the semiconductor substrate 102''' and is typically has the first doping type with a higher doping concentration than the substrate 102".

A photodetector 404 is arranged in the semiconductor substrate 102''' to accumulate charge (e.g., electrons) from photons incident on the photodetector 404. The photodetector 404 is, for example, a photodiode, and includes a collector region 406 and an absorption region 408 arranged over and abutting the collector region 406. The absorption region 408 corresponds to a doped region of the photodetector 404 initially absorbing photons incident on the photodetector 404. The absorption region 408 is typically a p-type doped region. The collector region 406 corresponds to a doped region of the photodetector 404 storing charge collected by the photodetector 404. The collector region 406 has an opposite doping type as the absorption region 408 and the region of the semiconductor substrate 102''' surrounding it. The collector region 406 is typically an n-type doped region.

A transfer transistor 410 is arranged proximate to the collector region 406 with a channel region 412 overlapping with the collector region 406. The channel region 412 is a region where an inversion channel forms. The transfer transistor 410 includes a transfer gate dielectric structure 414 and a transfer gate 416 arranged over the semiconductor substrate 102'''. The transfer gate dielectric structure 414 is arranged between the semiconductor substrate 102''' and the transfer gate 416 to electrically isolate the transfer gate 416 from the semiconductor substrate 102'''. The transfer gate dielectric structure 414 and the transfer gate 416 are respectively, for example, silicon dioxide and polysilicon. In some embodiments, a transfer gate voltage implant region 418 is arranged in the semiconductor substrate 102''' below the transfer gate 416. The transfer gate voltage implant region 418 corresponds to a doped region of the semiconductor substrate 102''' employed to adjust the threshold voltage. Typically, the transfer gate voltage implant region 418 has the same doping type as the semiconductor substrate 102''' or the well region 402. Disposed on and/or along sidewalls of the transfer gate 416 and the transfer gate dielectric structure 414, the transfer transistor 410 includes a transfer gate sidewall structure 420. The transfer gate sidewall structure 420 is, for example, a dielectric, such as, for example, silicon dioxide or silicon nitride.

A floating diffusion node (FDN) 422 is arranged in the semiconductor substrate 102''' overlapping the channel region 412 of the transfer transistor 410 and on an opposite side of the channel region 412 as the photodetector 404. When the transfer transistor 410 is activated (e.g., by applying a voltage to the transfer gate 416), an inversion channel is formed in the channel region 412 of the transfer transistor 410, thereby allowing accumulated charge in the photodetector 404 to flow from the collector region 406 to the FDN 422. The FDN 422 is a doped region of the semiconductor substrate 102''' having a same doping type as the collector region 406, such as, for example, n-type. The FDN 422 and the collector region 406 double as source/drain regions for the transfer transistor 410.

A source follower transistor 424 allows the charge at the FDN 422 to be observed without removing the accumulated charge. The source follower transistor 424 includes a pair of source follower source/drain regions 426, 428 arranged on opposite sides of a source follower gate 430 and a source follower channel region 432. In some embodiments, the source follower gate 430 is connected to the FDN 422, and the source follower source/drain regions 426, 428 are connected between a power source (not shown) and an output (not shown). The source follower transistor 424 further includes a source follower gate dielectric structure 434 arranged between the source follower gate 430 and the semiconductor substrate 102''', and a source follower gate sidewall structure 436 arranged along sidewalls of the source follower gate 430 and the source follower gate dielectric structure 434. The source follower gate 430, the source follower gate dielectric structure 434, and the source follower gate sidewall structure 436 are respectively, for example, silicon dioxide, polysilicon, and silicon dioxide. The source follower source/drain regions 426, 428 are, for example, doped semiconductor regions having a same type as the collector region 406, such as, for example, n+-type.

A reset transistor 438 clears charge stored at the FDN 422 when active. The reset transistor 438 includes a pair of reset source/drain regions 422, 426 arranged on opposite sides of a reset gate 440 and a reset channel region 442. In some embodiments, the reset source/drain regions 422, 426 are connected between the power source and the FDN 422. The reset transistor 438 further includes a reset gate dielectric structure 444 arranged between the reset gate 440 and the semiconductor substrate 102''', and a reset gate sidewall structure 446 arranged along sidewalls of the reset gate 440 and the reset gate dielectric structure 444. The reset gate 440, the reset gate dielectric structure 444, and the reset gate sidewall structure 446 are respectively, for example, silicon dioxide, polysilicon, and silicon dioxide. The reset source/drain regions 422, 426 are, for example, doped semiconductor regions having a same type as the collector region 406, such as, for example, n+-type.

A row select transistor 448 facilitates selection of the pixel sensor when arranged in a row with other pixel sensors. The row select transistor 448 includes a pair of row select source/drain regions 428, 450 arranged on opposite sides of a row select gate 452 and a row select channel region 454. In some embodiments, the row select source/drain regions 428, 450 are connected between the source follower transistor 424 and the output, or between the power source and the source follower transistor 424. Further, in some embodiments, the row select transistor 448 shares a source/drain region 428 with the source follower transistor 424. The row select transistor 448 further includes a row select gate dielectric structure 456 arranged between the row select gate 452 and the semiconductor substrate 102''', and a row select gate sidewall structure 458 arranged along sidewalls of the row select gate 452 and the row select gate dielectric structure 456. The row select gate 452, the row select gate dielectric structure 456, and the row select gate sidewall structure 458 are respectively, for example, silicon dioxide, polysilicon, and silicon dioxide. The row select source/drain regions 428, 450 are, for example, doped semiconductor regions having a same type as the collector region 406, such as, for example, n+-type An ILD layer 124'' is arranged over the pixel sensor, and contacts 126a'', 126b'' extend vertically through the ILD layer 124'' to the source/drain regions 422, 426, 428, 450 and/or the gates 416, 430, 440, 452. In some embodiments, the contacts 126'' include a power source contact 126a'' and an output contact 126b''. The power source contact 126a'' extends to a source/drain region 426 shared by the reset transistor 438 and the source/follower transistor 424, and the output contact 126b'' extends to a source/drain region 450 specific to (i.e., not shared by) the row select transistor 448. The ILD layer 124'' is or otherwise includes, for example, an extreme low-κ dielectric, and the contacts 126'' are or otherwise include, for example, a metal, such as copper or tungsten.

Figure 5:
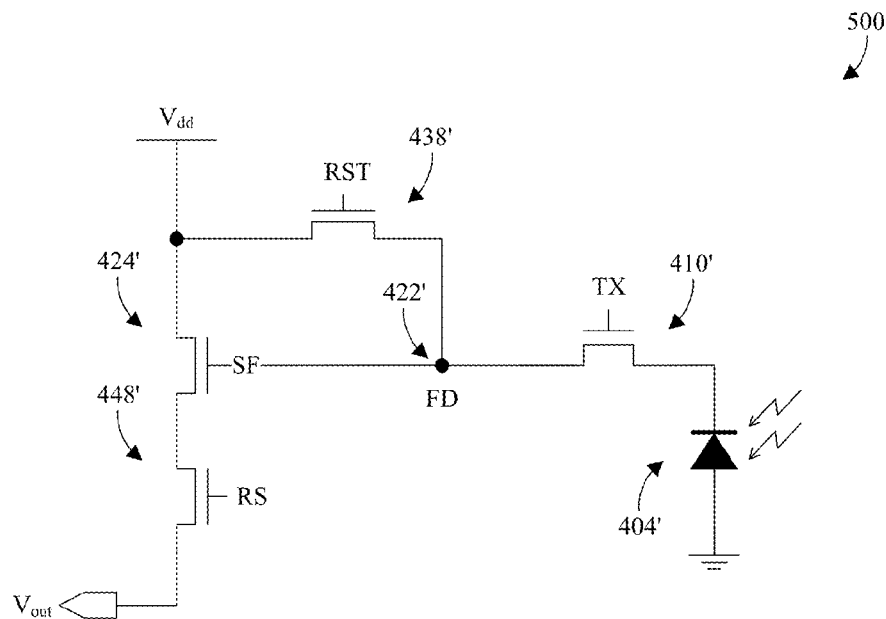
FIG. 5 illustrates a circuit diagram of some embodiments of a pixel sensor of an image sensor employing deep trench spacing isolation.

With reference to FIG. 5, a circuit diagram 500 of some embodiments of a pixel sensor, such as a pixel sensor of FIG. 1 or 2, is provided. The pixel sensor includes a photodetector 404', such as a photodiode, electrically connected to a FDN 422' by way of a transfer transistor 410'. The photodetector 404' accumulates charge (e.g., electrons) from photons incident on the photodetector 404'. The transfer transistor 410' selectively transfers charge from the photodetector 404' to the FDN 422'. A reset transistor 438' is electrically connected between a power source $V_{dd}$ and the FDN 422' to selectively clear charge at the FDN 422'. A source follower transistor 424' is electrically connected between the power source $V_{dd}$ and an output $V_{out}$, and gated by the FDN 422', to allow the charge at the FDN 422' to be observed without removing the charge. A row select transistor 448' is electrically connected between the source follower transistor 424' and the output $V_{out}$ to selectively output a voltage proportional to the charge at the FDN 422'.

During use the pixel sensor, the pixel sensor is exposed to an optical image for a predetermined integration period. Over this period of time, the pixel sensor records the intensity of light incident on the photodetector 404' by accumulating charge proportional to the light intensity in a collector region (not shown) of the photodetector 404'. After the predetermined integration period, the amount of accumulated charge is read. In some embodiments the amount of accumulated charge for the photodetector 404' is read by momentarily activating the reset transistor 438' to clear the charge stored at the FDN 422'. Thereafter, the row select transistor 448' is activated and the accumulated charge of the photodetector 404' is transferred to the FDN 422' by activating the transfer transistor 410' for a predetermined transfer period. During the predetermined transfer period, the voltage at the output $V_{out}$ is monitored. As the charge is transferred, the voltage at the output $V_{out}$ varies, typically decreasing. After the predetermined transfer period, the change in the voltage observed at the output $V_{out}$ is proportional to the intensity of light recorded at the photodetector 404'.

Figure 6A:
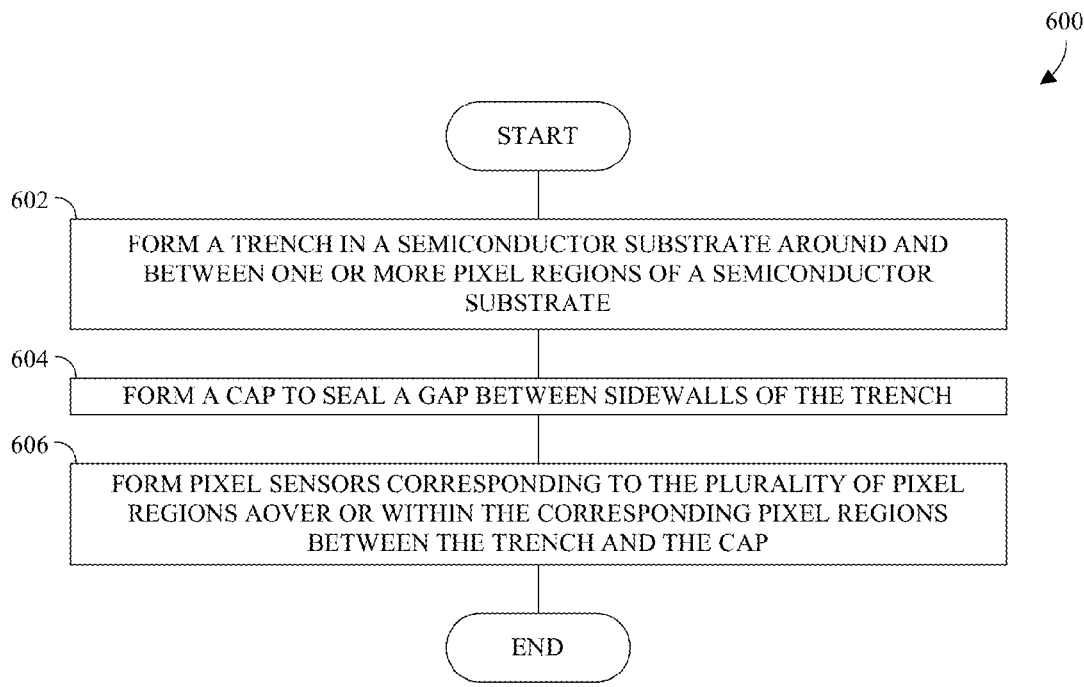
FIGS. 6A-C illustrate flow charts of some embodiments of methods for manufacturing an image sensor employing deep trench spacing isolation.

With reference to FIG. 6A, a flow chart 600 of some embodiments of a method for manufacturing an image sensor, such as the image sensor of FIG. 1 or 2, is provided. A trench is formed (Action 602) in a semiconductor substrate around and between one or more pixel regions of the semiconductor substrate. A cap is formed (Action 604) to seal a gap between sidewalls of the trench to form a cavity filled with a gas, such as air, or a vacuum. The gap laterally isolates the pixel regions. Pixel sensors corresponding to the plurality of pixel regions are formed (Action 606) over or within the corresponding pixel regions between the trench and the cap. Advantageously, employing the method reduces leakage and cross talk between neighboring pixel sensors. Further, the breakdown voltage between neighboring pixel sensors is increased, the latch-up effect is blocked or otherwise reduced, and pixel sensor density can be increased.

Figure 6B:
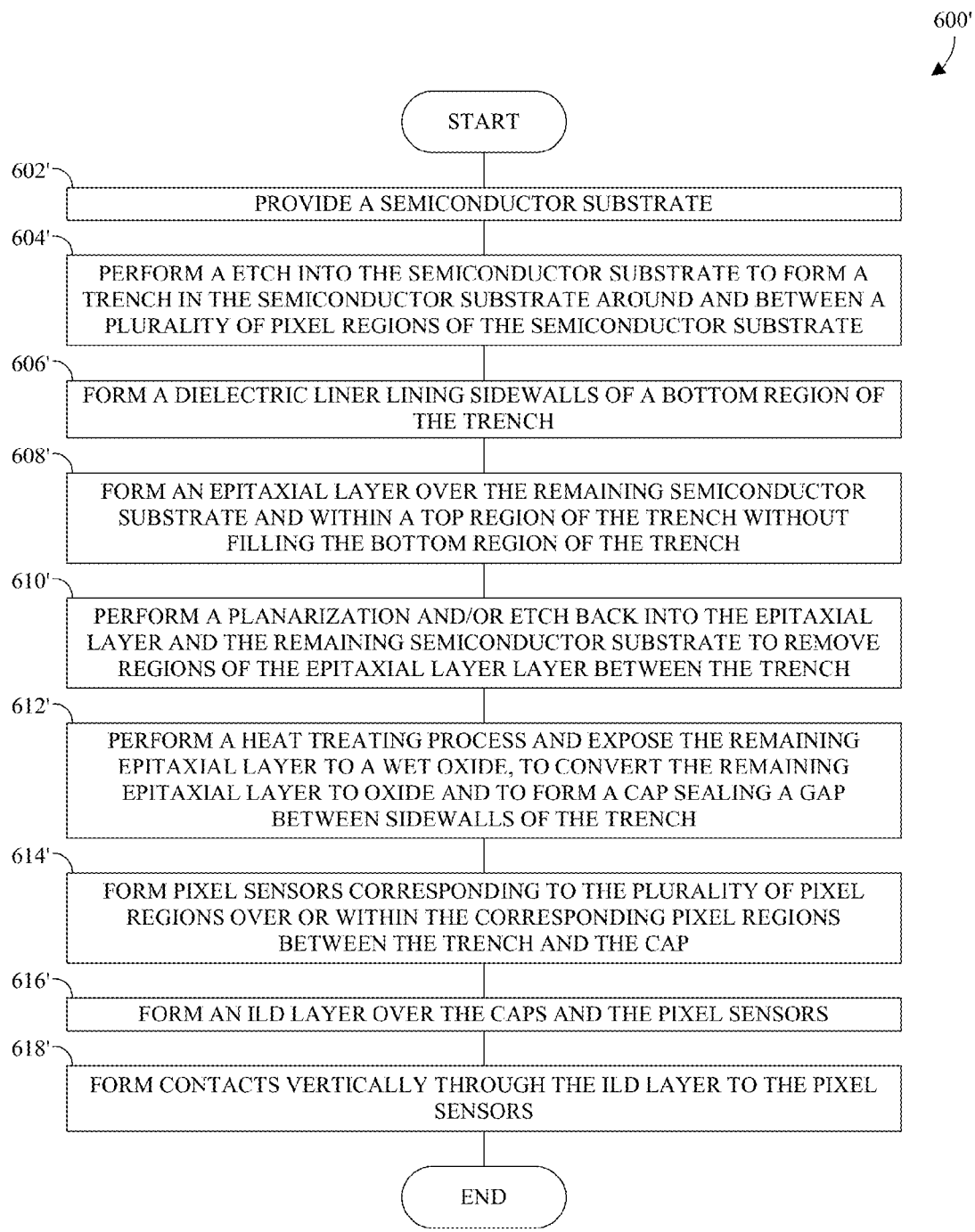

With reference to FIG. 6B, a flow chart 600' of embodiments of the method for manufacturing the image sensor of FIG. 1 is provided. A semiconductor substrate is provided (Action 602'). An etch is performed (Action 604') into the semiconductor substrate to form a trench in the semiconductor substrate around and between a plurality of pixel regions of the semiconductor substrate. A dielectric liner formed (Action 606') lining sidewalls of a bottom region of the trench, and an epitaxial layer is formed (Action 608') over the remaining semiconductor substrate and within a top region of the trench without filling the bottom region of the trench. A planarization and/or etch back is performed (Action 610') into the epitaxial layer and the remaining semiconductor substrate to remove regions of the epitaxial layer between the trench. A heat treating process is performed (Action 612') and the remaining epitaxial layer is exposed (Action 612') to a wet oxide, to convert the remaining epitaxial layer to oxide and to form a cap sealing a gap between sidewalls of the trench. Pixel sensors corresponding to the plurality of pixel regions are formed (Action 614') over or within the corresponding pixel regions between the trench and the cap. An ILD layer is formed (Action 616') over the caps and the pixel sensors, and contacts are formed (Action 618') vertically through the ILD layer to the pixel sensors.

Figure 6C:
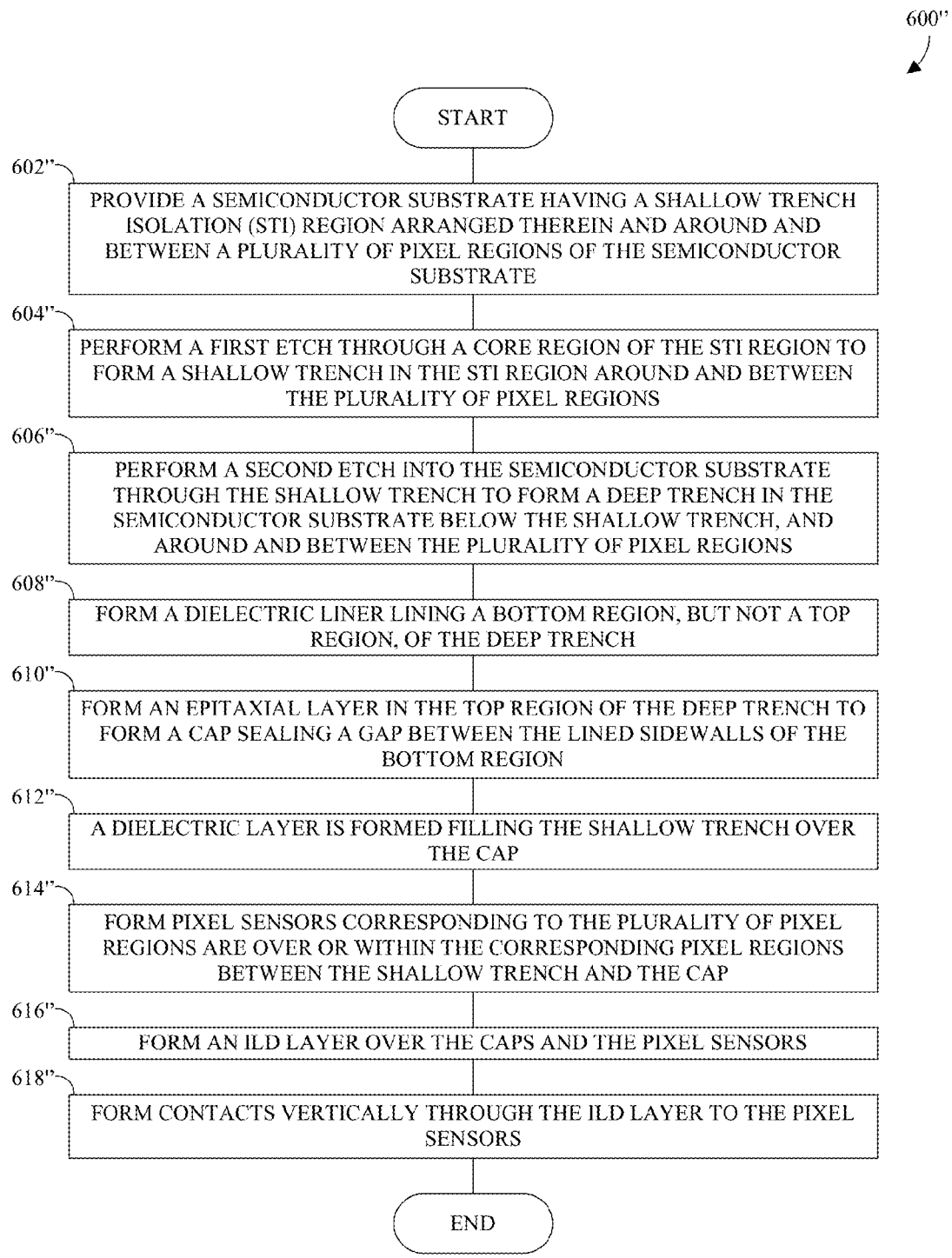

With reference to FIG. 6C, a flow chart 600'' of embodiments of the method for manufacturing the image sensor of FIG. 2 is provided. A semiconductor substrate having an STI region arranged therein and around and between a plurality of pixel regions of the semiconductor substrate is provided (Action 602"). A first etch is performed (Action 604") through a core region of the STI region to form a shallow trench in the STI region around and between the plurality of pixel regions. A second etch is performed (Action 606") into the semiconductor substrate through the shallow trench to form a deep trench in the semiconductor substrate below the shallow trench, and around and between the plurality of pixel regions. A dielectric liner lining a bottom region, but not a top region, of the deep trench is formed (Action 608"). An epitaxial layer is formed (Action 610") in the top region of the deep trench to form a cap sealing a gap between the lined sidewalls of the bottom region. A dielectric layer is formed (Action 612") filling the shallow trench over the cap, and pixel sensors corresponding to the plurality of pixel regions are formed (Action 614') over or within the corresponding pixel regions between the shallow trench and the cap. An ILD layer is formed (Action 616') over the caps and the pixel sensors, and contacts are formed (Action 618') vertically through the ILD layer to the pixel sensors.

While the disclosed methods (e.g., the method described by the flowchart 600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 7-20, cross-sectional views of some embodiments of the image sensor of FIG. 1 at various stages of manufacture are provided to illustrate the method of FIG. 6B. Although FIGS. 7-20 are described in relation to the method, it will be appreciated that the structures disclosed in FIGS. 7-20 are not limited to the method, but instead may stand alone as structures independent of the method. Similarly, although the method is described in relation to FIGS. 7-20, it will be appreciated that the method is not limited to the structures disclosed in FIGS. 7-20, but instead may stand alone independent of the structures disclosed in FIGS. 7-20.

Figure 7:
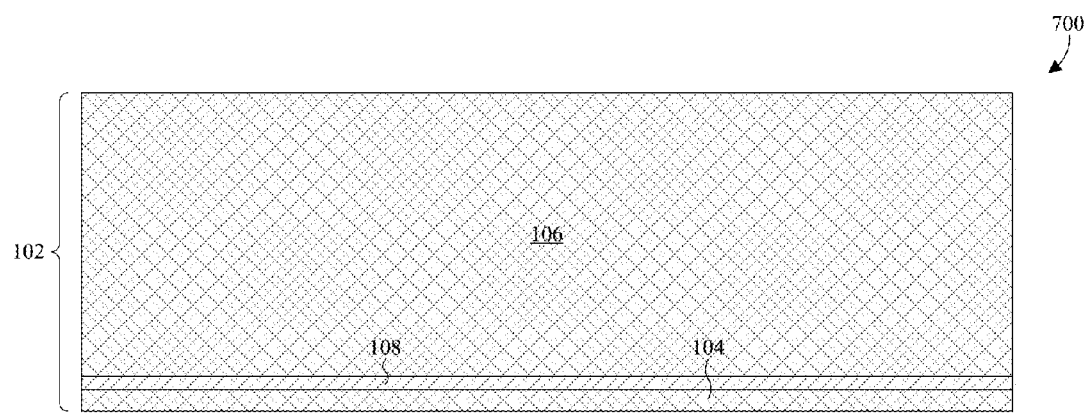
FIGS. 7-35 illustrate a series of cross-sectional views of some embodiments of an image sensor at various stages of manufacture, the image sensor employing deep trench spacing isolation.

FIG. 7 illustrates a cross-sectional view 700 of some embodiments corresponding to Action 602'.

As shown by FIG. 7, a semiconductor substrate 102 is provided. The semiconductor substrate 102 is, for example, a bulk substrate of silicon, germanium, or group III and group V elements. Alternatively, the semiconductor substrate 102 is, for example, a semiconductor-on-insulator SOI substrate. The SOI substrate includes, for example, a first silicon layer 104 and a second silicon layer 106 stacked vertically on opposing sides of an insulating layer 108. The first and second silicon layers 104, 106 are or otherwise include, for example, silicon, germanium, or group III and group V elements. The insulating layer 108 is or otherwise includes, for example, a dielectric, such as silicon nitride, silicon dioxide, or silicon oxynitride.

Figure 8:
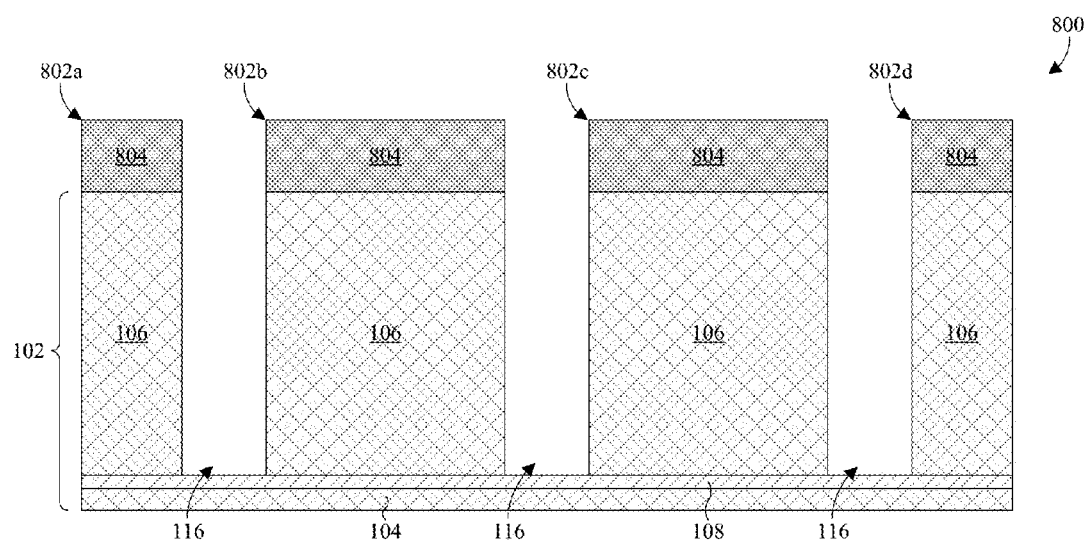

FIG. 8 illustrates a cross-sectional view 800 of some embodiments corresponding to Action 604'.

As shown by FIG. 8, a first etch is performed into semiconductor substrate 102 to form a trench 116 around and between one or more pixel regions 802a-d. The trench 116 is, for example, at least about 0.15 micrometers, such as about 0.5-1 micrometers, wide and/or at least about 3 micrometers, such as about 7-10 micrometers, deep. A pixel region 802 corresponds to a region of the semiconductor substrate 102 where a pixel sensor, such as an APS, will be formed. In some embodiments, the first etch extends through the first silicon layer 104 to the insulating layer 108. Further, in some embodiments, the process for the first etch includes forming a first photoresist layer over a top surface of the semiconductor substrate 102, patterning the first photoresist layer, applying an etchant to the patterned first photoresist layer 804 and the semiconductor substrate 102, and removing the patterned first photoresist layer 804.

Figure 9:
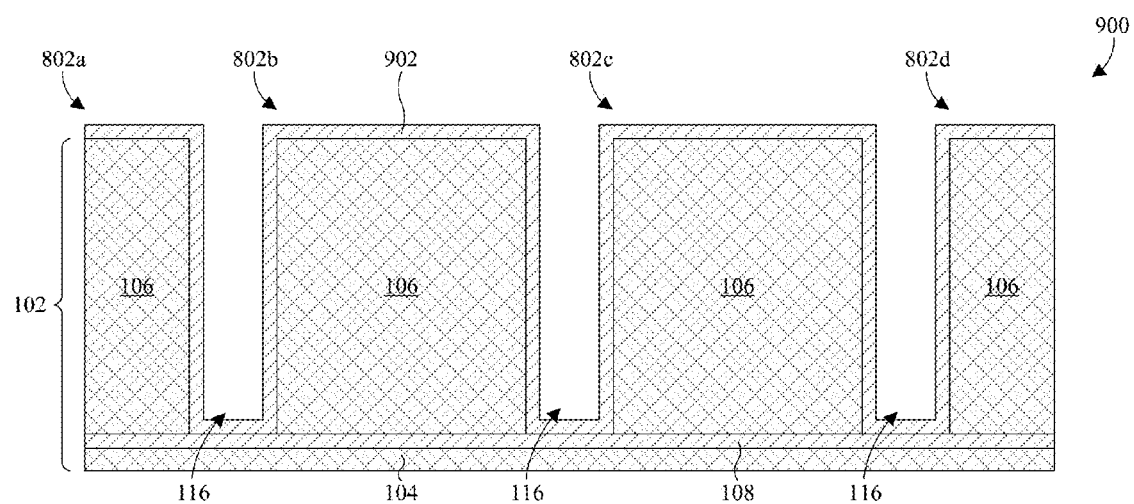
Figure 10:
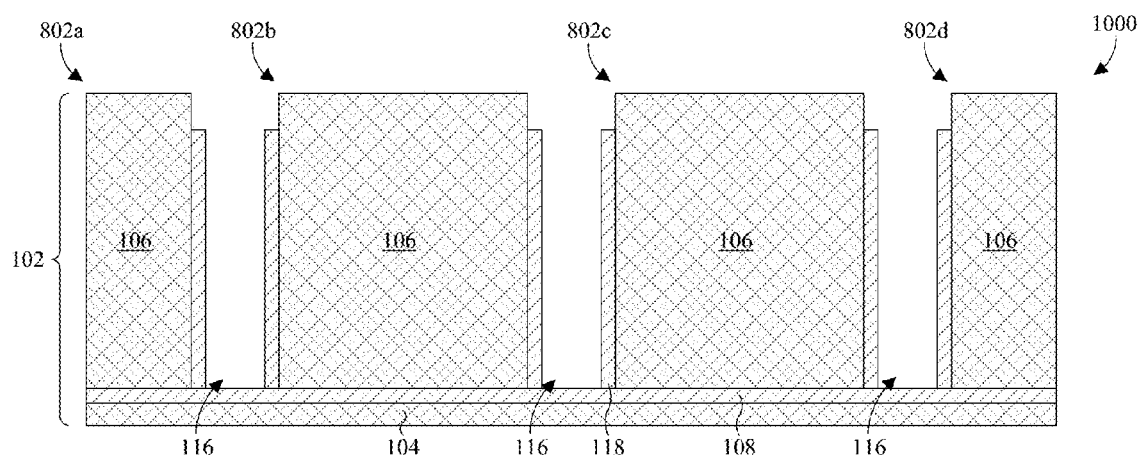

FIGS. 9 and 10 illustrate cross-sectional views 900, 1000 of some embodiments corresponding to Action 606'.

As shown by FIG. 9, a lining layer 902 is formed over the semiconductor substrate 102 to line the trench 116. The lining layer 902 is, for example, formed conformally. In some embodiments, the lining layer 902 may be deposited by way of a vapor deposition technique (e.g., PVD, CVD, PE-CVD, etc.). Further, the lining layer 902 is or otherwise includes, for example, an oxide, such as silicon dioxide.

As shown by FIG. 10, a second etch is performed into the lining layer 902 to remove the lining layer 902 from horizontal surfaces in a manner that forms a dielectric liner 118 lining sidewalls of the trench 116. The second etch is, for example, an anisotropic etch performed for the approximate time needed to etch the lining layer 902 to at least about 0.15 micrometers, such as about 0.5-1 micrometer, below a top surface of the semiconductor substrate 102.

Figure 11:
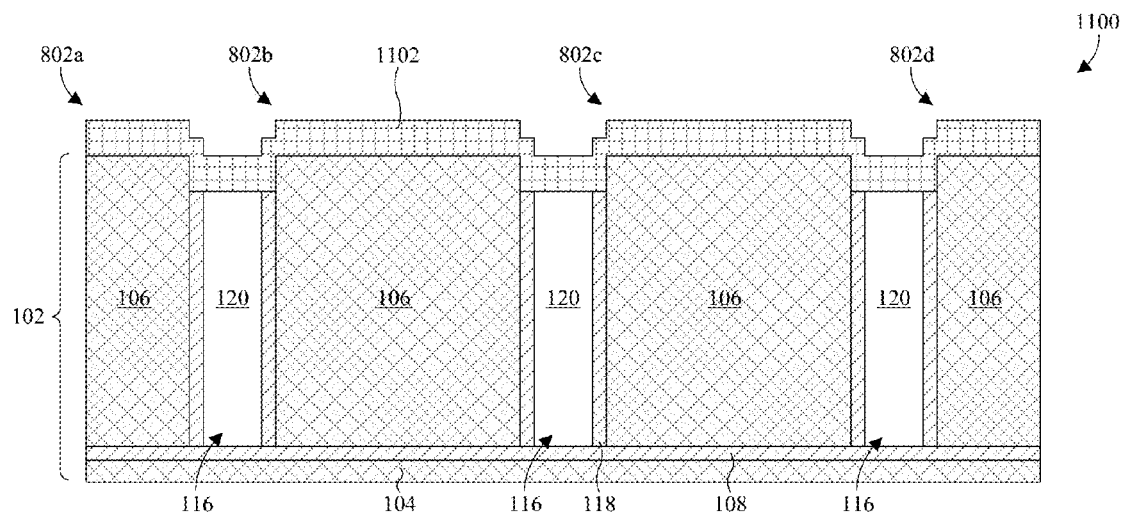

FIG. 11 illustrates a cross-sectional view 1100 of some embodiments corresponding to Action 608'.

As shown by FIG. 11, an epitaxial layer 1102 is formed over the semiconductor substrate 102 and the dielectric liner 118. The epitaxial layer 1102 is typically formed by selectively depositing the epitaxial layer 1102 to cover, but not line or fill, the trench 116 (e.g., during deposition viscosity between epitaxially deposited particles will cause the particles to block an opening of the trench 116). In that regard, the epitaxial layer 1102 seals a gap 120 between the lined sidewalls of the trench 116. The seal is, for example, a hermetic seal or a vacuum seal. The epitaxial layer 1102 is or otherwise includes, for example, silicon.

Figure 12:
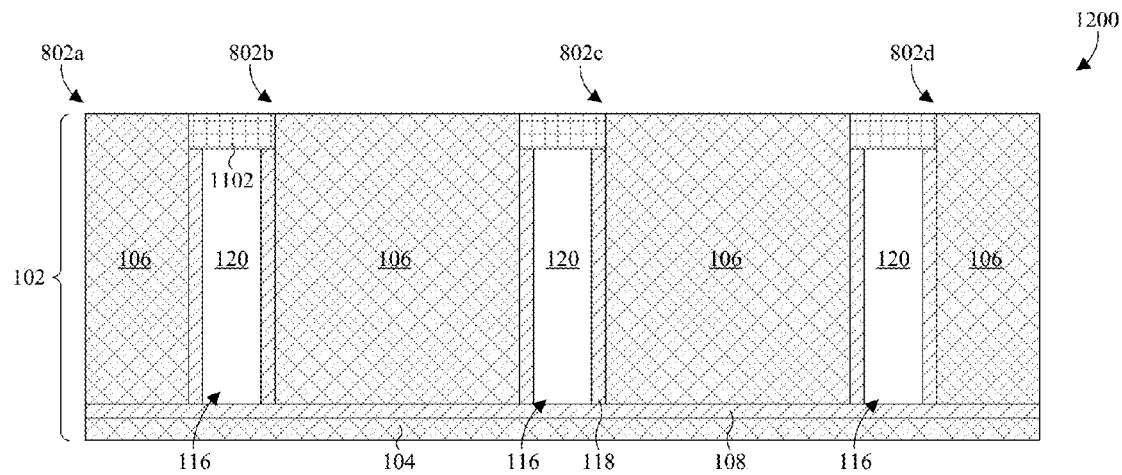
Figure 13:
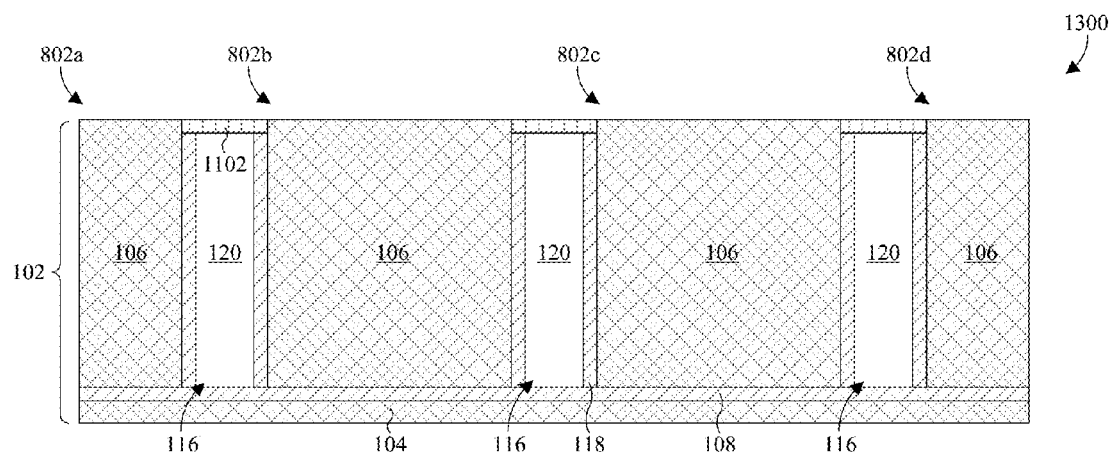

FIGS. 12 and 13 illustrate cross-sectional views 1200, 1300 of some embodiments corresponding to Action 610'.

As shown by FIG. 12, a planarization is performed into the epitaxial layer 1102 and, in some embodiments, the semiconductor substrate 102. The planarization extends to about even with a top surface of the semiconductor substrate 102. In some embodiments, the planarization includes a chemical mechanical polishing (CMP) process.

As shown by FIG. 13, a third etch is performed into the epitaxial layer 1102 and the semiconductor substrate 102 to remove regions damaged by the prior actions. This has the effect of improving performance of subsequently formed pixel sensors. In some embodiments, the third etch is performed by a wet etch.

FIGS. 14-17 illustrate cross-sectional views 1400, 1500, 1600, 1700 of some embodiments corresponding to Action 612'.

Figure 14:
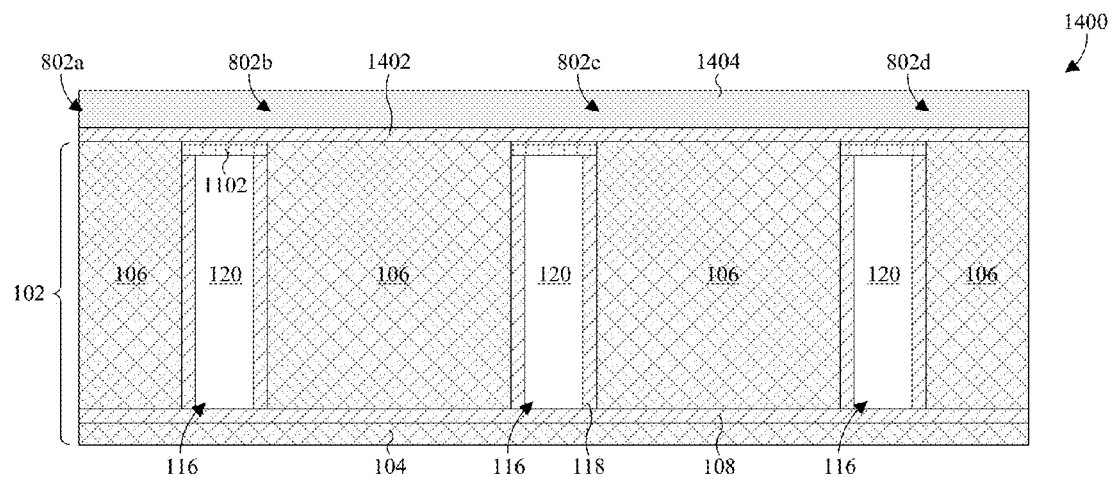

As shown by FIG. 14, a first mask layer 1402 and a second mask layer 1404 are formed in that order over the epitaxial layer 1102 and the semiconductor substrate 102. The first mask layer 1402 is, for example, about 150-350 Angstroms thick, and is or otherwise includes, for example, an oxide, such as silicon dioxide. The second mask layer 1404 is, for example, 1500-3000 Angstrom thick, and is or otherwise includes, for example, silicon nitride.

Figure 15:
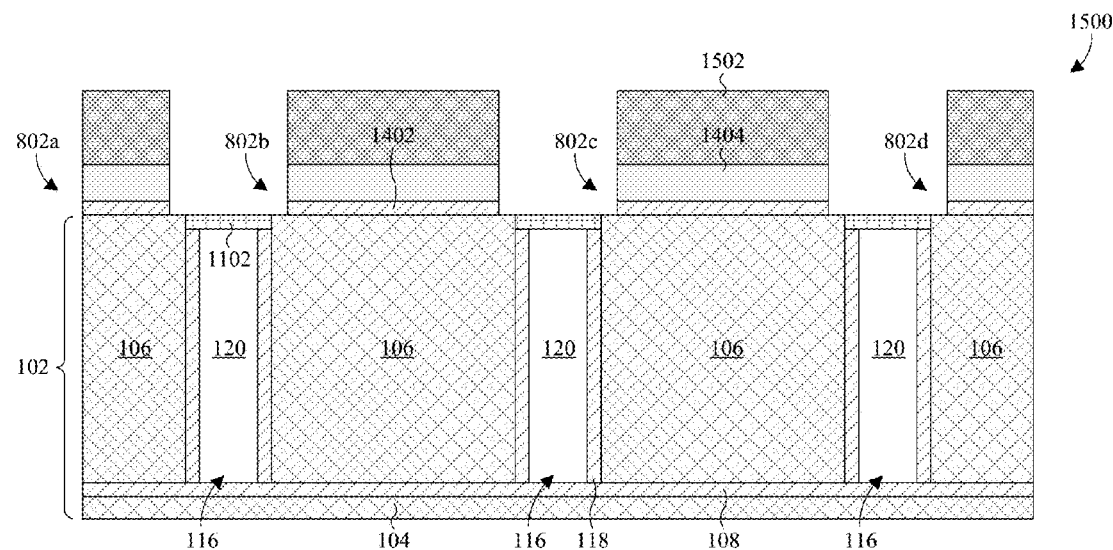

As shown by FIG. 15, a fourth etch is performed through regions of the first and second mask layers 1402, 1404 over the epitaxial layer 1102 to expose the epitaxial layer 1102. In some embodiments, these regions have a larger footprint than the footprint of the epitaxial layer 1102. Further, in some embodiments, the process for the fourth etch includes forming a second photoresist layer over a top surface of the second mask layer 1404, patterning the second photoresist layer, applying an etchant to the patterned second photoresist layer 1502 and the second mask layer 1404, and removing the patterned second photoresist layer 1502.

Figure 16:
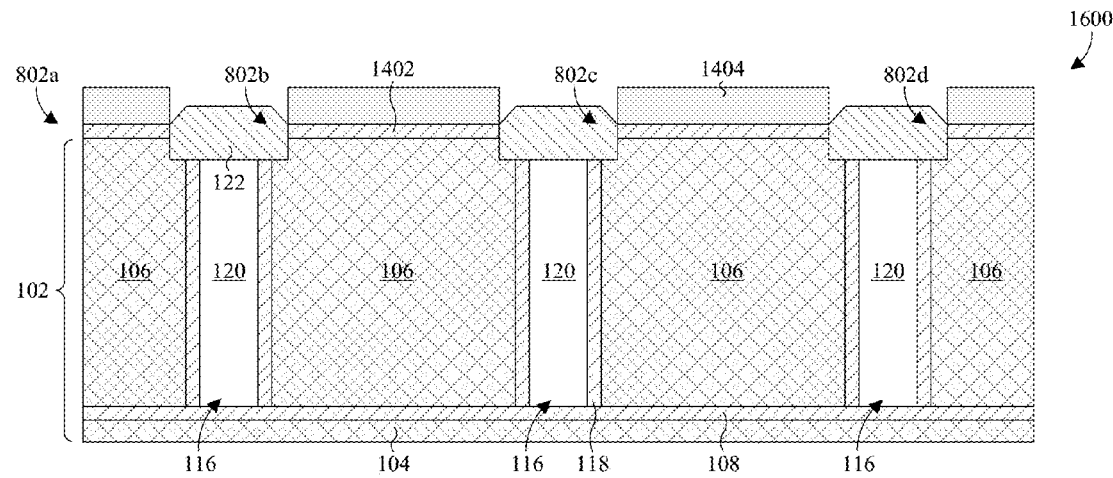

As shown by FIG. 16, a cap 122 is formed over the trench 116 from the epitaxial layer 1102 and the semiconductor substrate 102. In some embodiments, the formation includes exposing the epitaxial layer 1102 to a wet oxide and/or thermal processing (e.g., heating). The cap 122 is, for example, about 2000-5000 Angstroms thick, and is or otherwise includes, for example, an oxide, such as silicon dioxide.

Figure 17:
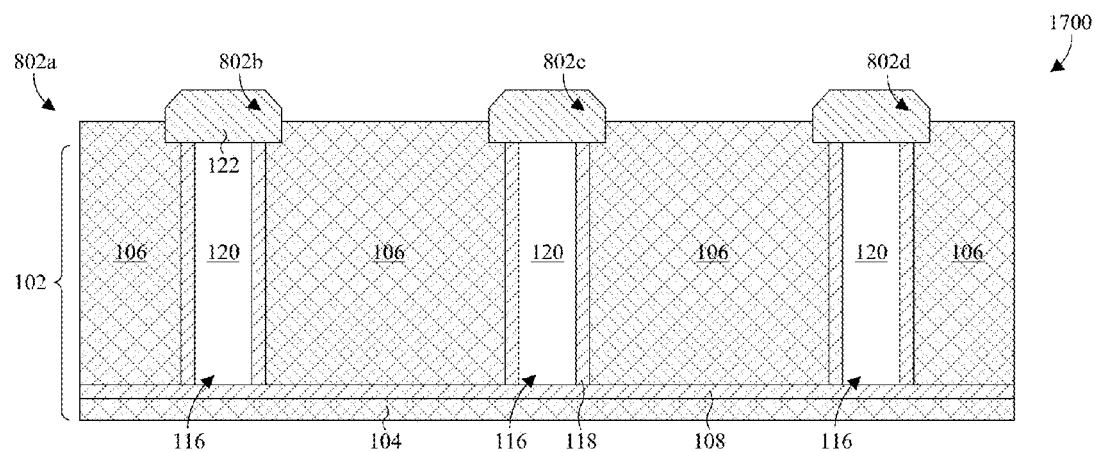

As shown by FIG. 17, a fifth etch is performed to remove the first and second mask layers 1402, 1404.

Figure 18:
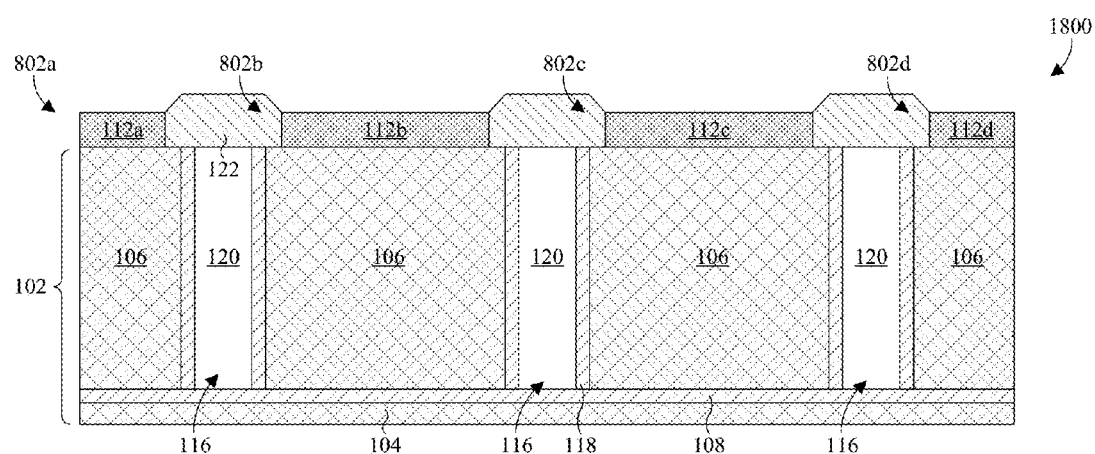

FIG. 18 illustrates a cross-sectional view 1800 of some embodiments corresponding to Action 614'.

As shown by FIG. 18, pixel sensors 112a-d are formed over corresponding pixel regions 802. Typically, there is a one-to-one correspondence between the pixel sensors 112 and the pixel regions 802. The pixel sensors 112 are formed by selectively implanting n- or p-type dopants into the semiconductor substrate 102 and forming transistor gates over the semiconductor substrate 102. Some embodiments of a pixel sensor 112 are illustrated in FIG. 4.

In some embodiments, an epitaxial layer is formed over the pixel regions 802 before forming the pixel sensors 112 to improve the defect condition of the substrate surface. For example, silicon can be deposited with silicon tetrachloride decomposing and hydrogen at approximately 1200 degrees Celsius. This forms on the silicon surface to remove defects on the substrate surface.

Figure 19:
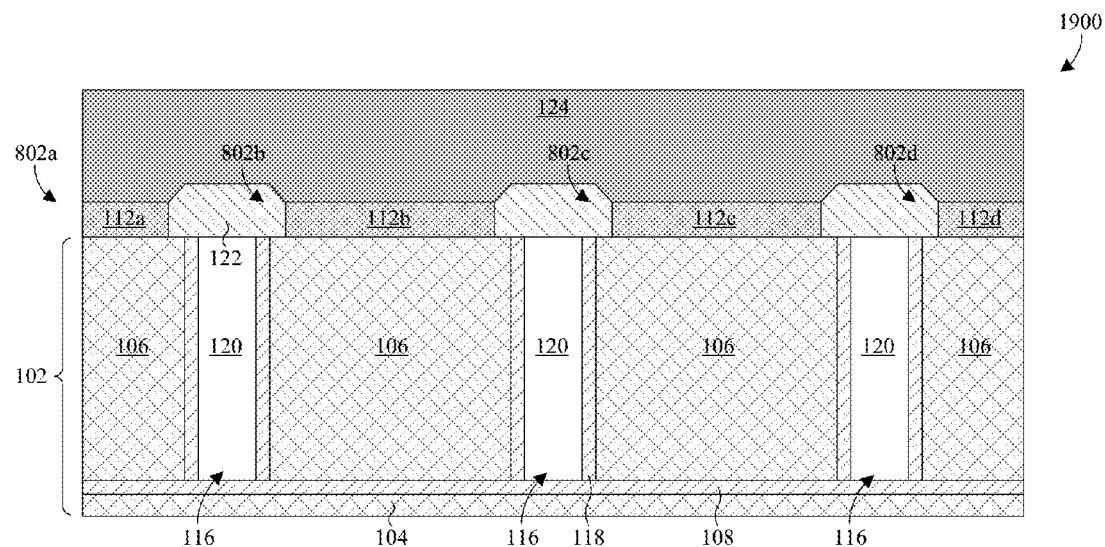

FIG. 19 illustrates a cross-sectional view 1900 of some embodiments corresponding to Action 616'.

As shown by FIG. 19, an ILD layer 124 is formed over the cap 122 and the pixel sensors 112. The ILD layer 124 is or otherwise includes, for example, an extreme low-κ dielectric.

Figure 20:
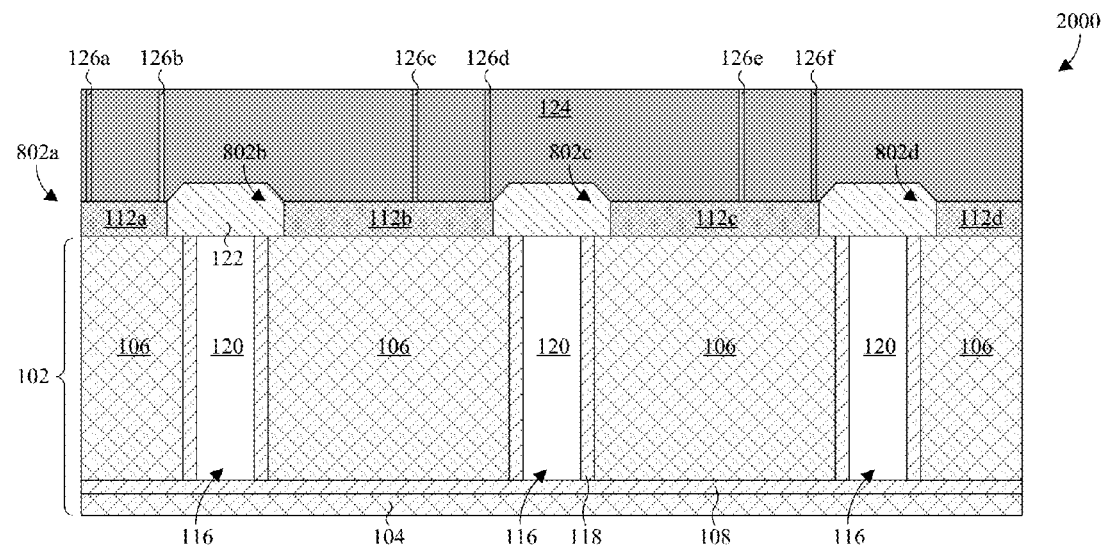

FIG. 20 illustrates a cross-sectional view 2000 of some embodiments corresponding to Action 618'.

As shown by FIG. 20, contacts 126a-f are formed through the ILD layer 124 to the pixel sensors 112. The contacts 126 are or otherwise include, for example, a metal, such as copper or tungsten.

With reference to FIGS. 21-35, cross-sectional views of some embodiments of the image sensor of FIG. 2 at various stages of manufacture are provided to illustrate the method of FIG. 6C. Although FIGS. 21-35 are described in relation to the method, it will be appreciated that the structures disclosed in FIGS. 21-35 are not limited to the method, but instead may stand alone as structures independent of the method. Similarly, although the method is described in relation to FIGS. 21-35, it will be appreciated that the method is not limited to the structures disclosed in FIGS. 21-35, but instead may stand alone independent of the structures disclosed in FIGS. 21-35.

Figure 21:
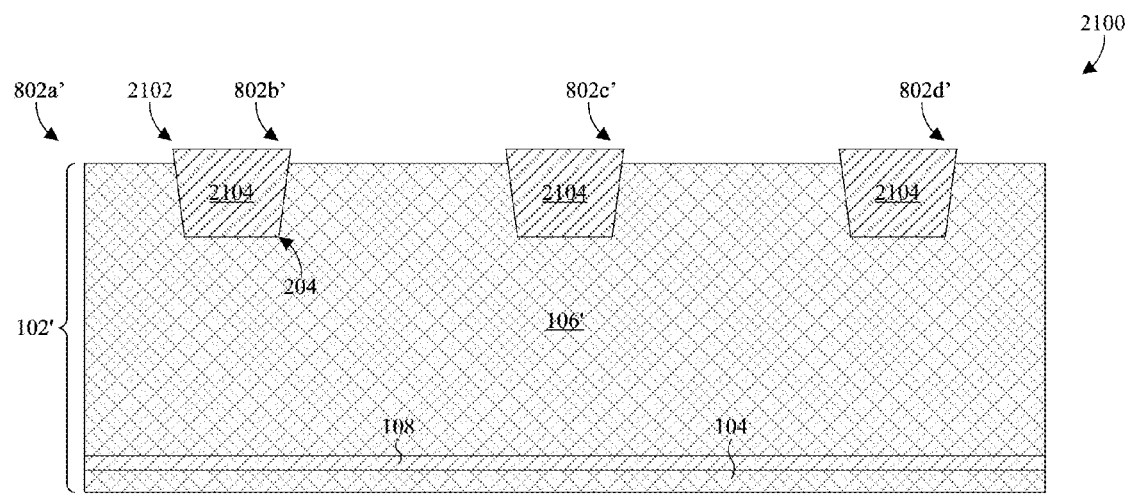

FIG. 21 illustrates a cross-sectional view 2100 of some embodiments corresponding to Action 602".

As shown by FIG. 21, a semiconductor substrate 102' is provided. The semiconductor substrate 102' is, for example, a bulk substrate of silicon, germanium, or group III and group V elements. Alternatively, the semiconductor substrate 102' is, for example, a semiconductor-on-insulator SOI substrate. The SOI substrate includes, for example, a first silicon layer 104 and a second silicon layer 106' stacked vertically on opposing sides of an insulating layer 108. The first and second silicon layers 104, 106' are or otherwise include, for example, silicon, germanium, or group III and group V elements. The insulating layer 108 is or otherwise includes, for example, a dielectric, such as silicon nitride, silicon dioxide, or silicon oxynitride.

Also shown by FIG. 21, an STI region 2102 is provided or formed around and between one or more pixel regions 802a'-d'. A pixel region 802' corresponds to a region of the semiconductor substrate 102' where a pixel sensor, such as an APS, will be formed. The STI region 2102 includes a shallow trench 204 around and between the pixel regions 802' and a dielectric filler 2104 filling the shallow trench 204. The dielectric filler 2104 is or otherwise includes, for example, silicon dioxide, silicon nitride, or silicon oxynitride. In some embodiments, the STI region 2102 has as a width of about 0.7 micrometers at a top surface of the semiconductor substrate, and/or has a width tapering vertically down with, for example, the profile of an isosceles trapezoid.

Figure 22:
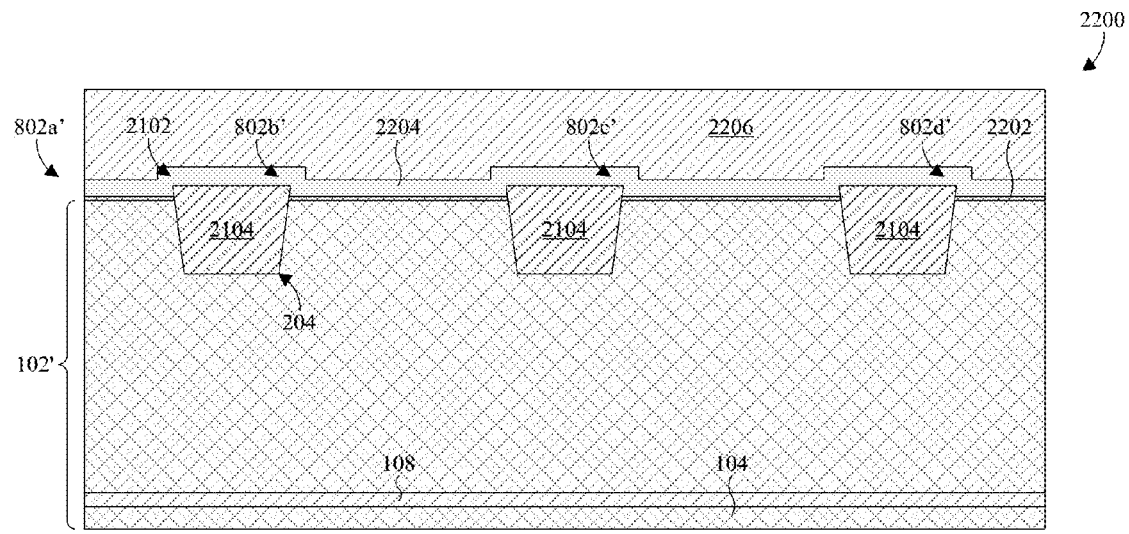
Figure 23:
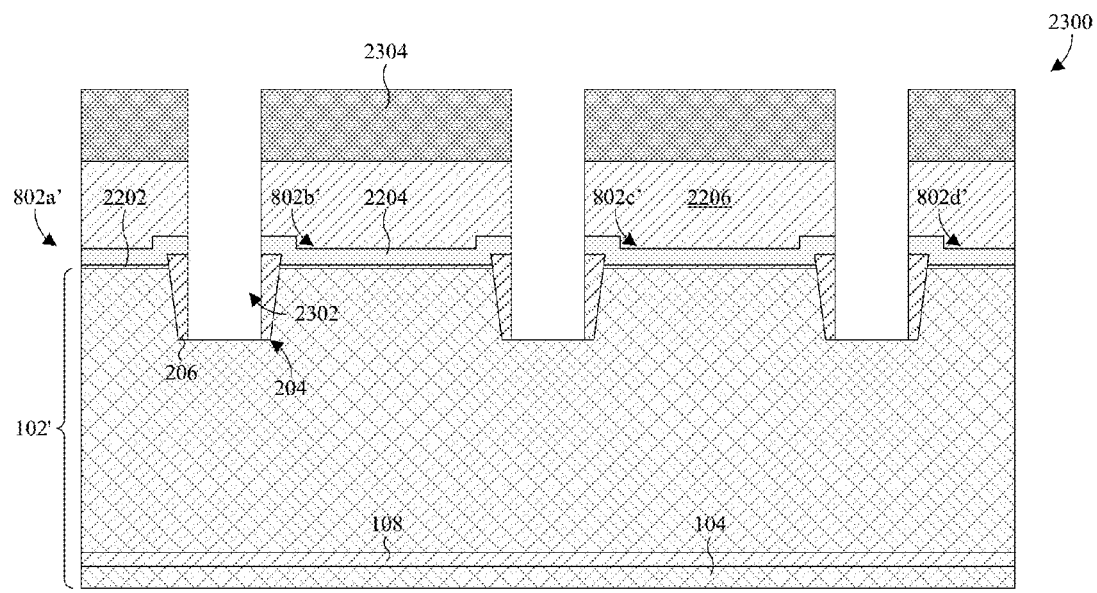

FIGS. 22 and 23 illustrate cross-sectional views 2200, 2300 of some embodiments corresponding to Action 604".

As shown by FIG. 22, a buffer layer 2202 is formed over the semiconductor substrate 102'. In some embodiments, the buffer layer 2202 is grown on the semiconductor substrate 102'. The buffer layer 2202 is or otherwise includes, for example, an oxide, such as silicon dioxide, or another dielectric.

Also shown by FIG. 22, a first mask layer 2204 and a second mask layer 2206 are formed in that order over the buffer layer 2202 and the STI region 2102. In some embodiments, the first mask layer 2204 and/or the second mask layer 2206 are conformally formed. The first mask layer 2204 is or otherwise includes, for example, silicon nitride, and the second mask layer 2206 is or otherwise includes, for example, an oxide, such as silicon dioxide.

As shown by FIG. 23, a first etch is performed through the STI region 2102 and regions of the first and second mask layers 2204, 2206 over the STI region (2102 of FIG. 22) to clear a central region 2302 of the shallow trench 204 and to expose the semiconductor substrate 102'. The central region 2302 typically has a smaller footprint than the STI region 2102 and, in some embodiments, has a width of at least about 0.15 micrometers, such as about 0.5-1 micrometers. Further, the sidewalls of the central region 2302 are defined by a first dielectric liner 206 formed from the dielectric filler 2104 and lining sidewalls of the shallow trench 204. In some embodiments, the process for the first etch includes forming a first photoresist layer over a top surface of the second mask layer 2206, patterning the first photoresist layer, applying an etchant to the patterned second photoresist layer 2304 and the second mask layer 2206, and removing the first patterned photoresist layer 2304.

Figure 24:
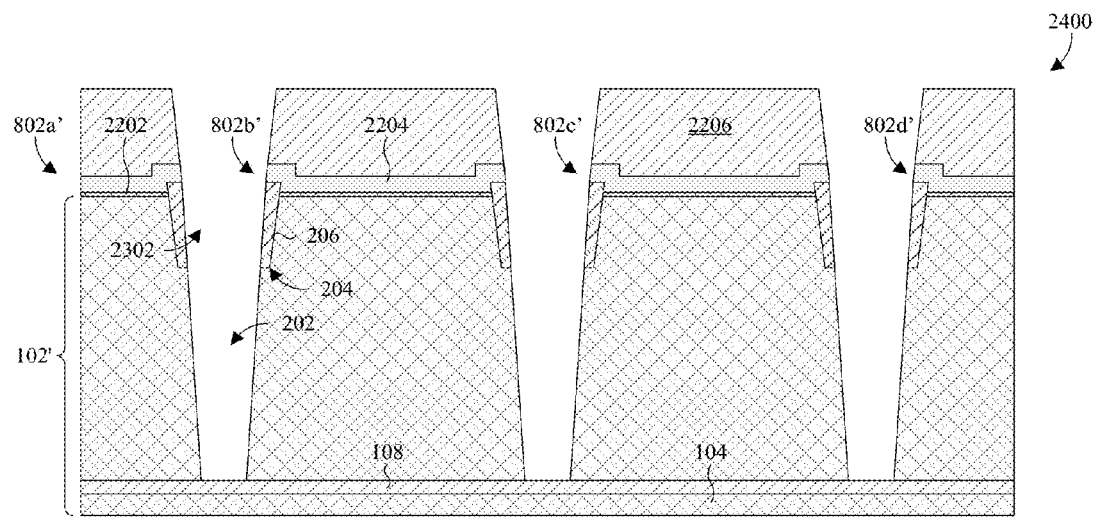

FIG. 24 illustrates a cross-sectional view 2400 of some embodiments corresponding to Action 606".

As shown by FIG. 24, a second etch is performed into the semiconductor substrate 102' to form a deep trench 202 below the shallow trench 204. The process for the second etch is performed using the first and second msk layers 2204, 2206 as mask. In some embodiments, the second etch extends through the first silicon layer 104 to the insulating layer 108 and/or to at least about 3 micrometers, such as about 7-10 micrometers, below a top surface of the semiconductor substrate 102', and/or the deep trench has a width tapering vertically down. Further, in some embodiments, the second etch erodes the first dielectric liner 206 so that the central region 2302 of the shallow trench 204 has a width tapering downward.

FIGS. 25-28 illustrate cross-sectional views 2500, 2600, 2700, 2800 of some embodiments corresponding to Action 608".

Figure 25:
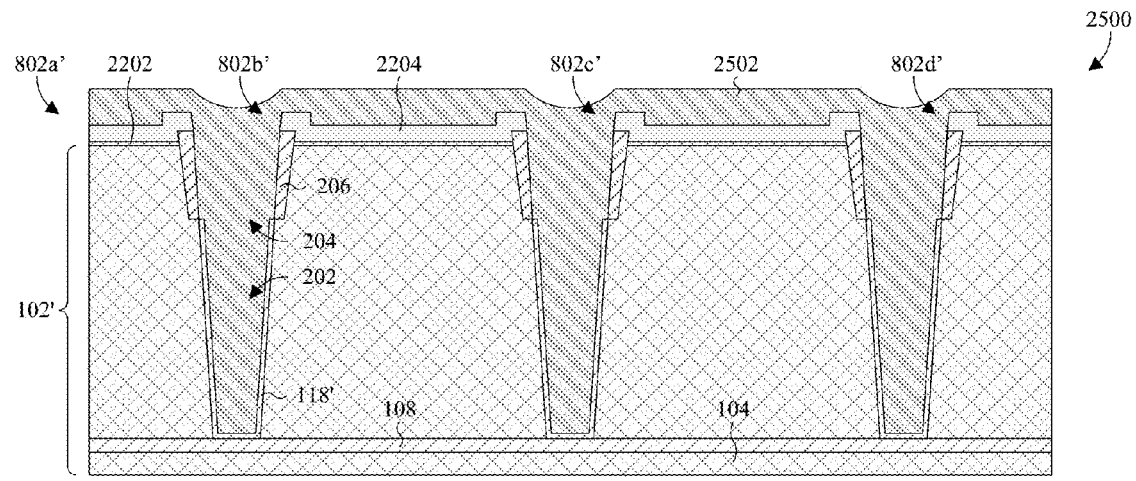

As shown by FIG. 25, a third etch is performed into the second mask layer 2206 to remove the second mask layer 2206. Further, a second dielectric liner 118' is formed lining the deep trench 202, and a second photoresist layer 2502 is formed over the first mask layer 2204 and filling the shallow and deep trenches 202, 204.

Figure 26:
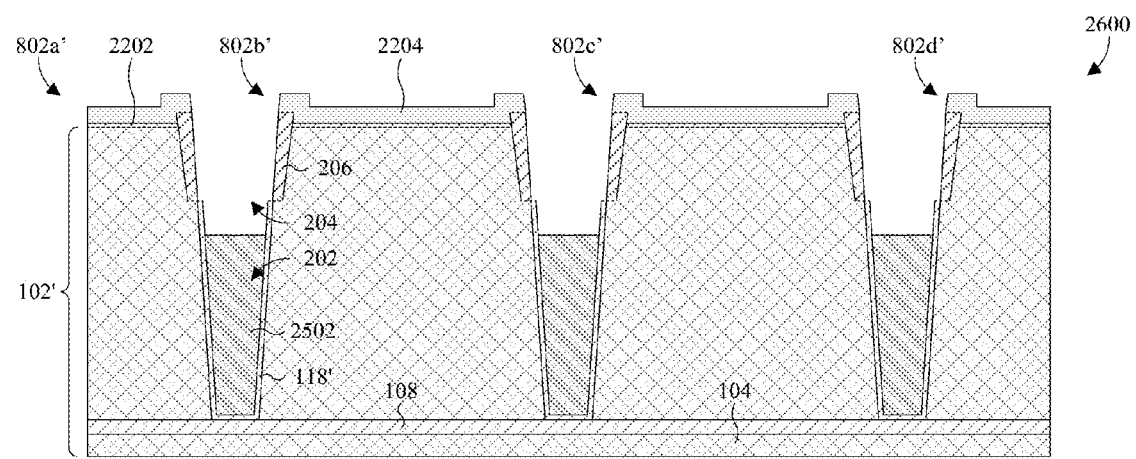

As shown by FIG. 26, a fourth etch is performed into the second photoresist layer 2502 to below an interface between the deep and shall trenches 202, 204.

Figure 27:
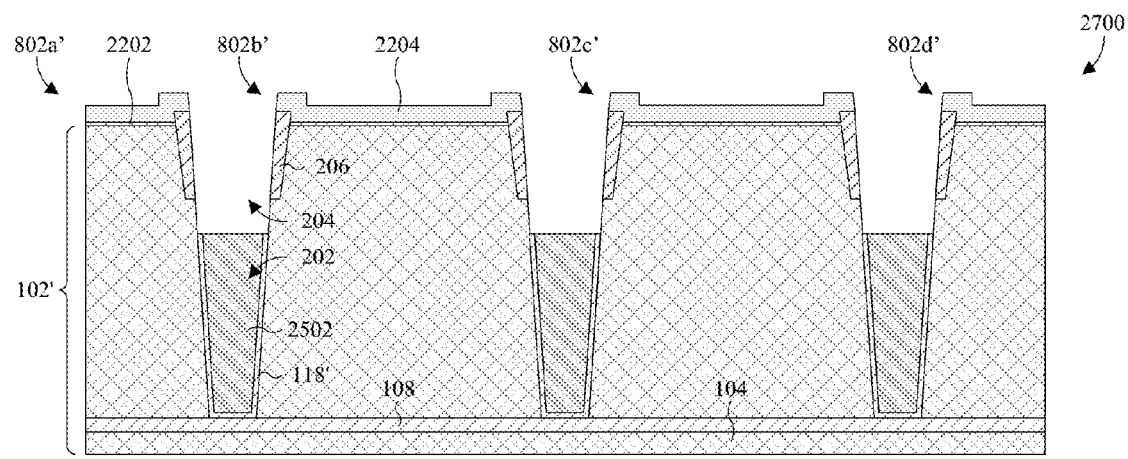

As shown by FIG. 27, a fifth etch is performed into the second dielectric liner 118' to remove top regions uncovered by the second photoresist layer 2502.

Figure 28:
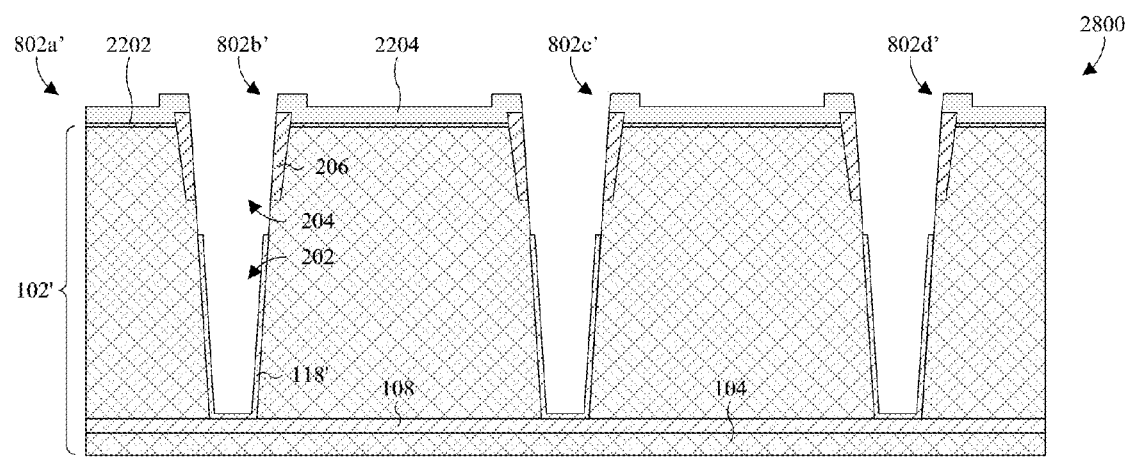

As shown by FIG. 28, a sixth etch is performed into the second photoresist layer 2502 to remove the second photoresist layer 2502.

Figure 29:
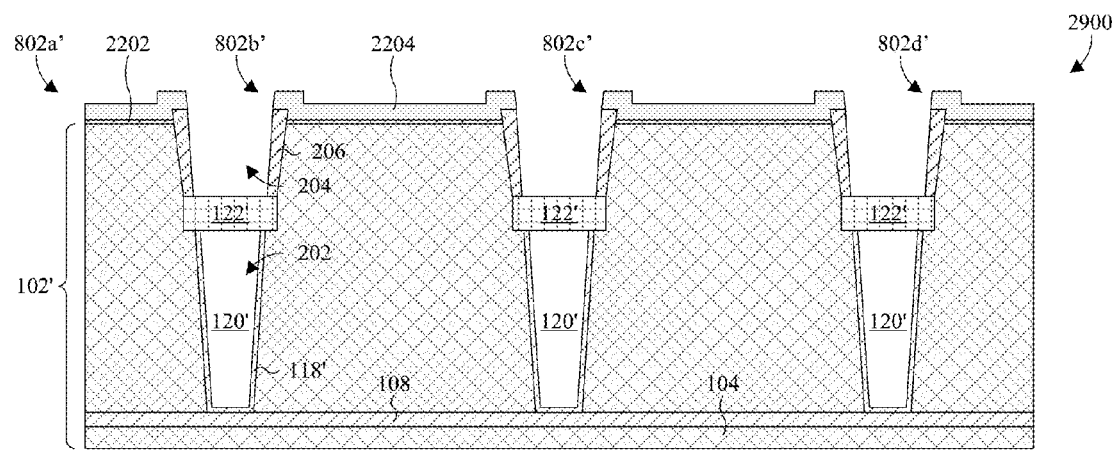

FIG. 29 illustrates a cross-sectional view 2900 of some embodiments corresponding to Action 610".

As shown by FIG. 29, a cap 122' is formed in a top region of the deep trench 202 between unlined regions of the semiconductor substrate 102'. In some embodiments, the cap 122' is formed from an epitaxial layer being or otherwise including, for example, silicon and/or being selectively deposited. The cap 122' seals a gap 120' between the lined sidewalls of the deep trench 202. The seal is, for example, a hermetic seal or a vacuum seal.

Figure 30:
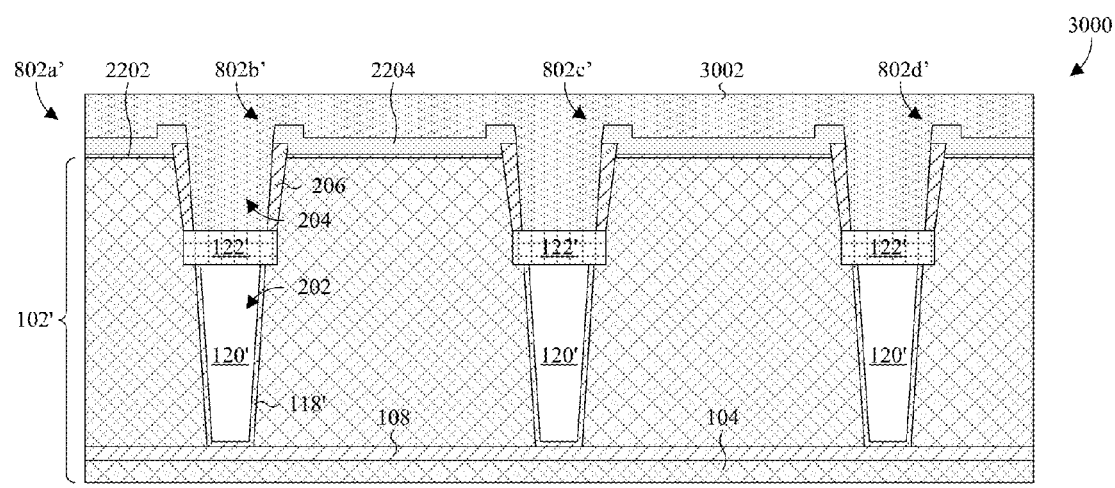
Figure 31:
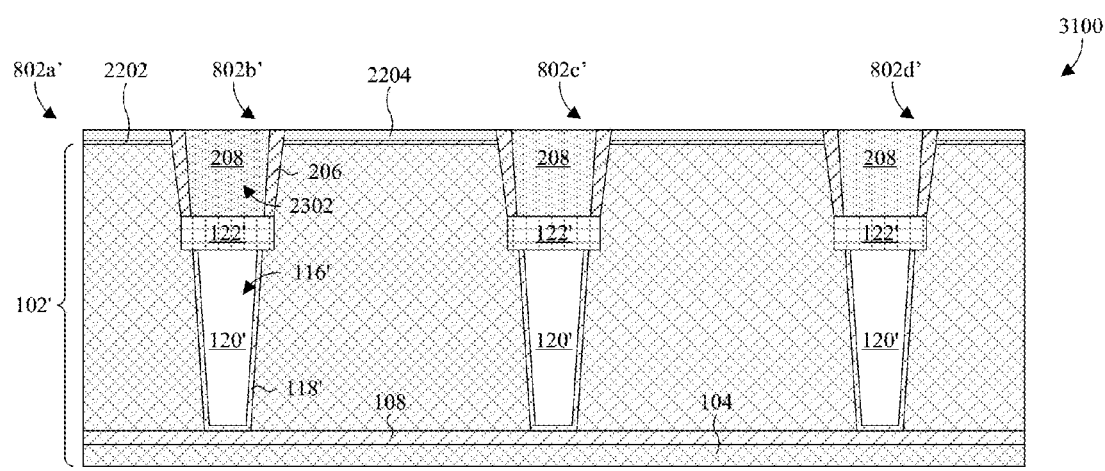
Figure 32:
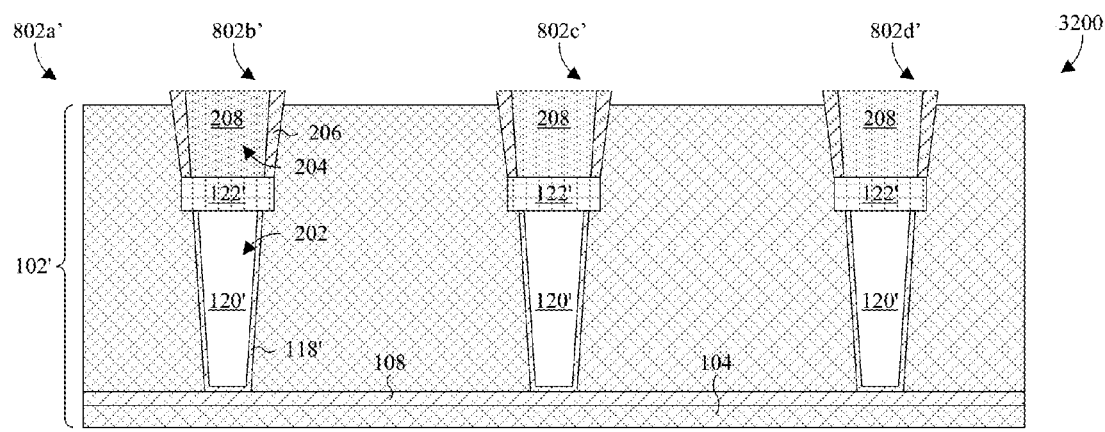

FIGS. 30-32 illustrate cross-sectional views 3000, 3100, 3200 of some embodiments corresponding to Action 612".

As shown by FIG. 30, a dielectric layer 3002 is formed over the first mask layer 2204 and the cap 122', and felling the shallow trench 204. In some embodiments, the dielectric layer 3002 is formed by a high density plasma deposition. The dielectric layer 3002 is or otherwise includes, for example, silicon dioxide, silicon nitride, or silicon oxynitride.

As shown by FIG. 31, a planarization and/or etch back is performed into the dielectric layer 3002 to expose the first mask layer 2204 and to the form a dielectric core 208 filling the shallow trench 204. In some embodiments, the planarization and/or etch back includes a CMP.

As shown by FIG. 32, a seventh etch is performed into the first mask layer 2204 and the buffer layer 2202 to remove the first mask and the buffer layers 2202, 2204.

Figure 33:
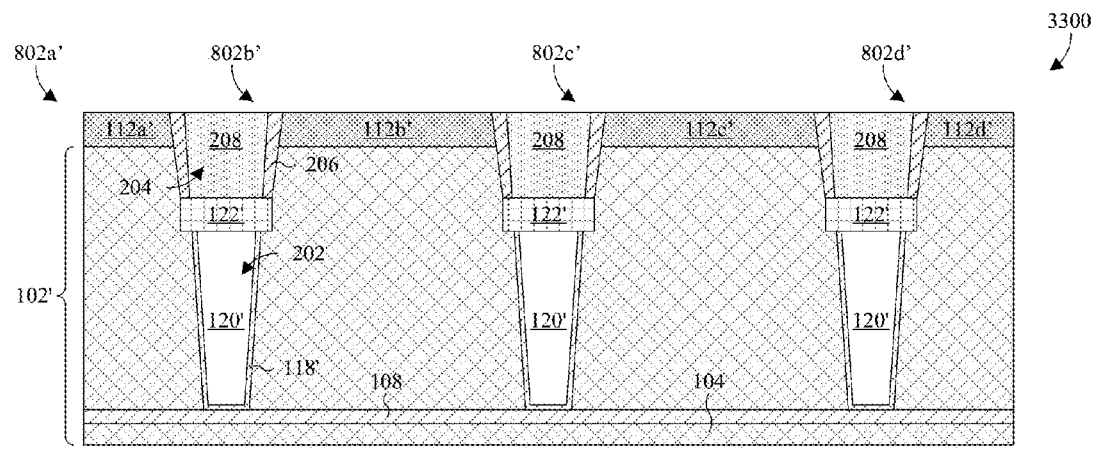

FIG. 33 illustrates a cross-sectional view 3300 of some embodiments corresponding to Action 614".

As shown by FIG. 33, pixel sensors 112a'-d' are formed over corresponding pixel regions 802'. Typically, there is a one-to-one correspondence between the pixel sensors 112' and the pixel regions 802'. The pixel sensors 112' are formed by selectively implanting n- or p-type dopants into the semiconductor substrate 102' and forming transistor gates over the semiconductor substrate 102'. Some embodiments of a pixel sensor 112' are illustrated in FIG. 4.

In some embodiments, an epitaxial layer is formed over the pixel regions 802' before forming the pixel sensors 112' to improve the defect condition of the substrate surface. For example, silicon can be deposited with silicon tetrachloride decomposing and hydrogen at approximately 1200 degrees Celsius. This forms on the silicon surface to remove defects on the substrate surface.

Figure 34:
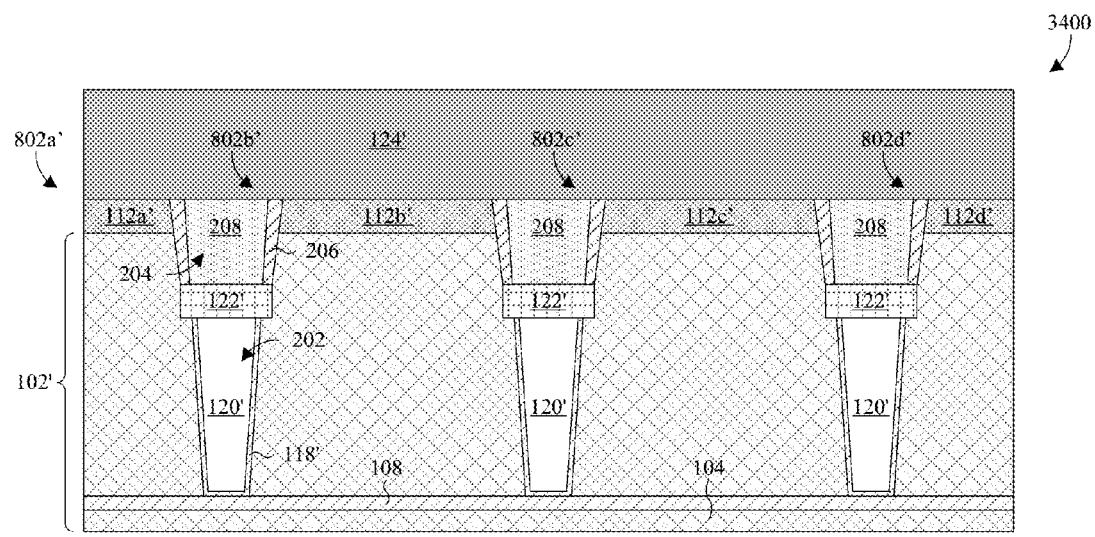

FIG. 34 illustrates a cross-sectional view 3400 of some embodiments corresponding to Action 616".

As shown by FIG. 34, an ILD layer 124' is formed over the cap 122' and the pixel sensors 112'. The ILD layer 124' is or otherwise includes, for example, an extreme low-κ dielectric.

Figure 35:
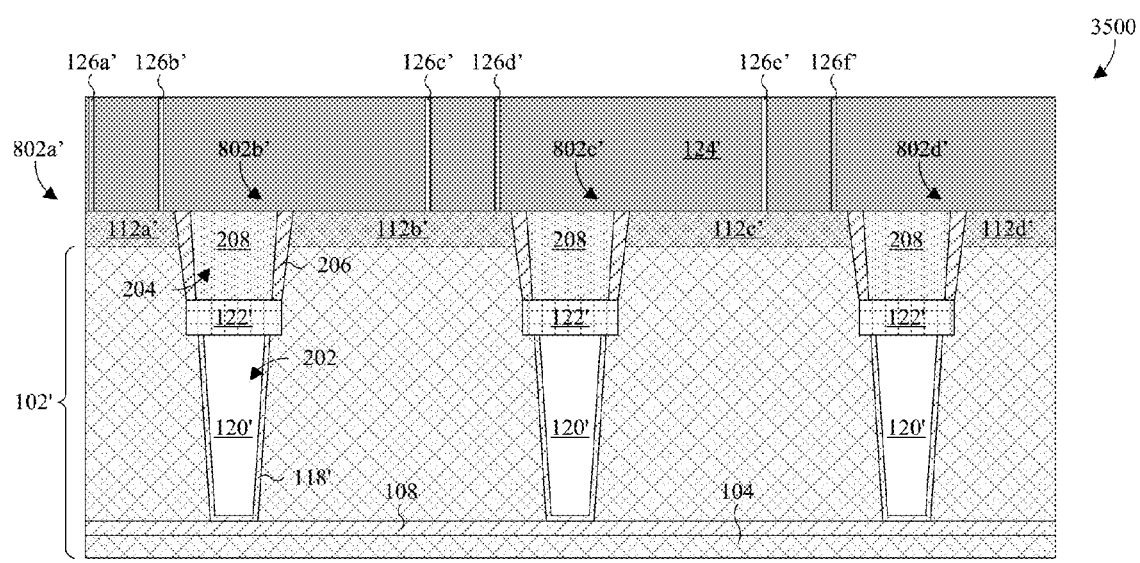

FIG. 35 illustrates a cross-sectional view 3500 of some embodiments corresponding to Action 618".

As shown by FIG. 35, contacts 126a'-f' are formed through the ILD layer 124' to the pixel sensors 112'. The contacts 126' are or otherwise include, for example, a metal, such as copper or tungsten.

Thus, as can be appreciated from above, the present disclosure provides an image sensor. A plurality of pixel sensors is arranged over or within a semiconductor substrate. A trench is arranged in the semiconductor substrate around and between adjacent ones of the plurality of pixel sensors. The trench comprises a gap located between sidewalls of the trench. A cap is arranged over or within the trench at a position overlying the gap and configured to seal the gap.

In other embodiments, the present disclosure provides a method for manufacturing an image sensor. A trench is formed in a semiconductor substrate around and between a plurality of pixel regions of the semiconductor substrate. A cap is formed to seal a gap between sidewalls of the trench. Pixel sensors corresponding to the plurality of pixel regions are formed over or within the corresponding pixel regions between the trench and the cap.

In yet other embodiments, the present disclosure provides an image sensor. A semiconductor substrate has a core region and a peripheral region surrounding the core region. A peripheral isolation region is arranged between the core region and the peripheral region. Pixel sensors are arranged over or within the core region. A trench is arranged in the core region around and between the pixel sensors. A cap is arranged over or within the trench to seal an air gap between sidewalls of the trench. An integrated circuit is arranged in the peripheral region to support operation of the pixel sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a plurality of pixel sensors arranged over or within a semiconductor substrate;
   a trench arranged in the semiconductor substrate around and between adjacent ones of the plurality of pixel sensors, wherein the trench comprises a shallow region and a deep region underlying the shallow region;
   a gap located within the deep region of the trench and between sidewalls of the trench; and
   a cap arranged within the trench, wherein a top surface of the cap is arranged under the shallow region and a bottom surface of the cap is arranged over the deep region, wherein the cap is configured to seal the gap, and wherein the cap is formed of a semiconductor material epitaxially grown from surrounding portions of the semiconductor substrate.

2. The image sensor according to claim 1, further comprising:
a dielectric liner disposed on sidewalls of the shallow region, wherein the dielectric liner has a bottom surface overlying the top surface of the cap; and
a dielectric core laterally disposed between the dielectric liner within the shallow region.

3. The image sensor according to claim 1, wherein the deep region is lined by a dielectric liner, and wherein the dielectric liner has a top surface underlying the bottom surface of the cap.

4. The image sensor according to claim 1, wherein the semiconductor substrate is a silicon-on-insulator (SOI) substrate including a first silicon layer and a second silicon layer stacked vertically on opposing sides of an insulating layer, and wherein the trench vertically extends through the second silicon layer to the insulating layer.

5. The image sensor according to claim 1, wherein the trench extends to a range of between about 7 micrometers and about 10 micrometers into the semiconductor substrate.

6. The image sensor according to claim 1, wherein a pixel sensor of the plurality of pixel sensors includes a photodetector and a transfer transistor selectively connecting the photodetector to a floating diffusion node (FDN).

7. The image sensor according to claim 1, wherein the semiconductor substrate is segregated into a core region and a peripheral region by a peripheral isolation region arranged between the core and the peripheral regions, wherein the plurality of pixel sensors are arranged in the core region, and wherein the peripheral region surrounds the core region and includes supporting logic for the image sensor.

8. The image sensor according to claim 1, wherein a sidewall surface of the cap is laterally offset from a neighboring sidewall surface of the deep region of the trench in a direction extending away from the trench and into the semiconductor substrate.

9. The image sensor according to claim 1, wherein the cap has a rectangular profile.

10. An image sensor comprising:
a semiconductor substrate having a core region and a peripheral region surrounding the core region;
a peripheral isolation region arranged between the core region and the peripheral region;
pixel sensors arranged over or within the core region;
a trench arranged in the core region around and between the pixel sensors, wherein the trench comprises a shallow region and a deep region underlying the shallow region;
a cap arranged within the trench, between the shallow and deep regions, to seal an air gap in the deep region of the trench, between sidewalls of the trench, wherein the cap is a semiconductor material epitaxially grown from the semiconductor substrate;
a dielectric liner disposed on sidewalls of the shallow region, wherein the dielectric liner has a bottom surface overlying a top surface of the cap; and
an integrated circuit arranged in the peripheral region to support operation of the pixel sensors.

11. The image sensor according to claim 10, wherein the trench is separated into the shallow region and the deep region by the cap, and wherein the air gap is arranged below the shallow region and laterally between sidewalls of the deep region, and wherein the top surface of the cap is arranged under the shallow region and a bottom surface of the cap is arranged over the deep region.

12. The image sensor according to claim 10, further comprising:
a dielectric core laterally disposed between the dielectric liner and within the shallow region.

13. The image sensor according to claim 10, wherein the deep region is lined by a second dielectric liner, and wherein the second dielectric liner has a top surface underlying a bottom surface of the cap.

14. The image sensor according to claim 10, wherein the semiconductor substrate is a silicon-on-insulator (SOI) substrate, and wherein the trench extends to an insulating layer of the SOI substrate.

15. The image sensor according to claim 10, wherein one of the pixel sensors comprises a photodetector and a transfer transistor selectively connecting the photodetector to a floating diffusion node (FDN).

16. The image sensor according to claim 10, wherein the peripheral isolation region includes a second trench that is laterally spaced from the trench and includes a second air gap arranged between sidewalls of the second trench.

17. An image sensor comprising:
a pixel sensor arranged within a semiconductor substrate;
a trench arranged in the semiconductor substrate and laterally surrounding the pixel sensor, wherein the trench comprises a shallow region and a deep region underlying the shallow region; and
a cap sealing a cavity in the deep region of the trench and arranged between the shallow and deep regions of the trench, wherein a sidewall surface of the cap is laterally offset from a neighboring sidewall surface of the deep region of the trench in a direction extending away from the trench and into the semiconductor substrate, and wherein the cap is a semiconductor material.

18. The image sensor according to claim 17, wherein the cap hermetically seals the cavity.

19. The image sensor according to claim 17, wherein the cap is an epitaxial layer.

20. The image sensor according to claim 17, wherein the semiconductor substrate is a silicon-on-insulator (SOI) substrate, and wherein the trench extends to an insulating layer of the SOI substrate.

* * * * *